(12) United States Patent
Pelouch et al.

(10) Patent No.: US 6,894,828 B2
(45) Date of Patent: May 17, 2005

(54) POWER SCALABLE WAVEGUIDE AMPLIFIER AND LASER DEVICES

(75) Inventors: Wayne S. Pelouch, McKinney, TX (US); Duane D. Smith, Louisville, CO (US); Narasimha S. Prasad, Erie, CO (US)

(73) Assignee: Coherent Technologies, Inc., Louisville, CO (US)

( * ) Notice: Subject to any disclaimer, the term of this patent is extended or adjusted under 35 U.S.C. 154(b) by 0 days.

(21) Appl. No.: 09/968,974

(22) Filed: Oct. 1, 2001

(65) Prior Publication Data

US 2004/0008405 A1 Jan. 15, 2004

Related U.S. Application Data

(60) Provisional application No. 60/236,638, filed on Sep. 29, 2000, and provisional application No. 60/259,681, filed on Jan. 4, 2001.

(51) Int. Cl.$^7$ ............................................. H01S 3/00
(52) U.S. Cl. .................... 359/333; 359/337.3; 359/340; 359/347
(58) Field of Search ............................. 359/333, 337.3, 359/340, 347

(56) References Cited

U.S. PATENT DOCUMENTS

| | | | |
|---|---|---|---|
| 3,832,029 A | | 8/1974 | Bryngdahl |
| 3,838,908 A | | 10/1974 | Channin |
| 3,963,310 A | | 6/1976 | Giallorenzi et al. |
| 4,087,159 A | | 5/1978 | Ulrich |
| 4,488,304 A | * | 12/1984 | Shimizu et al. ............... 372/36 |
| 4,972,427 A | | 11/1990 | Streifer et al. |
| 5,268,787 A | * | 12/1993 | McIntyre .................... 359/347 |
| 5,287,368 A | * | 2/1994 | Fink ............................. 372/32 |
| 5,347,377 A | | 9/1994 | Revelli, Jr. et al. |
| 5,365,538 A | * | 11/1994 | Tumminelli et al. .......... 372/66 |
| 5,608,745 A | | 3/1997 | Hall et al. |
| 5,684,820 A | | 11/1997 | Jenkins et al. |
| 5,835,199 A | | 11/1998 | Phillips et al. |
| 6,151,338 A | * | 11/2000 | Grubb et al. .................. 372/6 |

FOREIGN PATENT DOCUMENTS

EP            0 363 076 A2    4/1990

OTHER PUBLICATIONS

Seiko instruments, optical fiber components glossery of terms, http://www.siifiber.com/html/faq/glossary.htm.*

(Continued)

*Primary Examiner*—Mark Hellner
(74) *Attorney, Agent, or Firm*—Cochran Freund & Young LLC; James R. Young

(57) ABSTRACT

The present invention is directed to guided wave systems, beam transport and waveguide techniques. The invention may comprise passive or active, hollow and dielectric core self-imaging mode wave guide systems, beam amplifiers (10, 40), laser resonators (70), beam transports, and waveguides. Embodiments may include rectangular cross-section waveguides, and preferably maintaining spatial profile of an input beam, such as a Gaussian beam, through the self-imaging period of the waveguide while unique new capabilities to mitigate non-linear distortions that corrupt spatial, spectral and temporal coherence and polarization. Additional aspects may include, for example, transport, amplification, phase/frequency control or modulation, deflection, conversion, synthetic aperture, distributed aperture, beam forming, beam steering, beam combining, power sampling, power combining and power splitting, among other features. Some embodiments may provide a self-imaging, multimode, waveguide (10) and self-imaging guided wave systems and beam transport. Embodiments of the present invention may further provide a method of self-imaging, multimode beam transport and other self-imaging wave guidance techniques.

43 Claims, 10 Drawing Sheets

OTHER PUBLICATIONS

Baker H J et al. "Self–Imaging and high beam quality operation in multi–mode planar waveguide optical amplifiers" Optics Express, Mar. 25, 2002 Opt. Soc. America USA vol. 10.

Ulrich R et al. "Self–Imaging in Homogeneous planar optics waveguides." Applied Physics Letters, American Institute of Physics—NY,US. vol. 27 No. 6 p. 337–339.

Tidwell S C et al. "Scaling CW Diode–end–pumped ND:Yag lasers to high average power." IEEE Journal of Quantum Electronics, IEEE NY,US. vol. 28 No. 4.

Ulrich R et al. "Resolution of Self–Images in planar optical waveguides" Journal of the Optical Society of America. American Institute of Physics. NY,US vol.68 No.5 pp. 583–592.

* cited by examiner

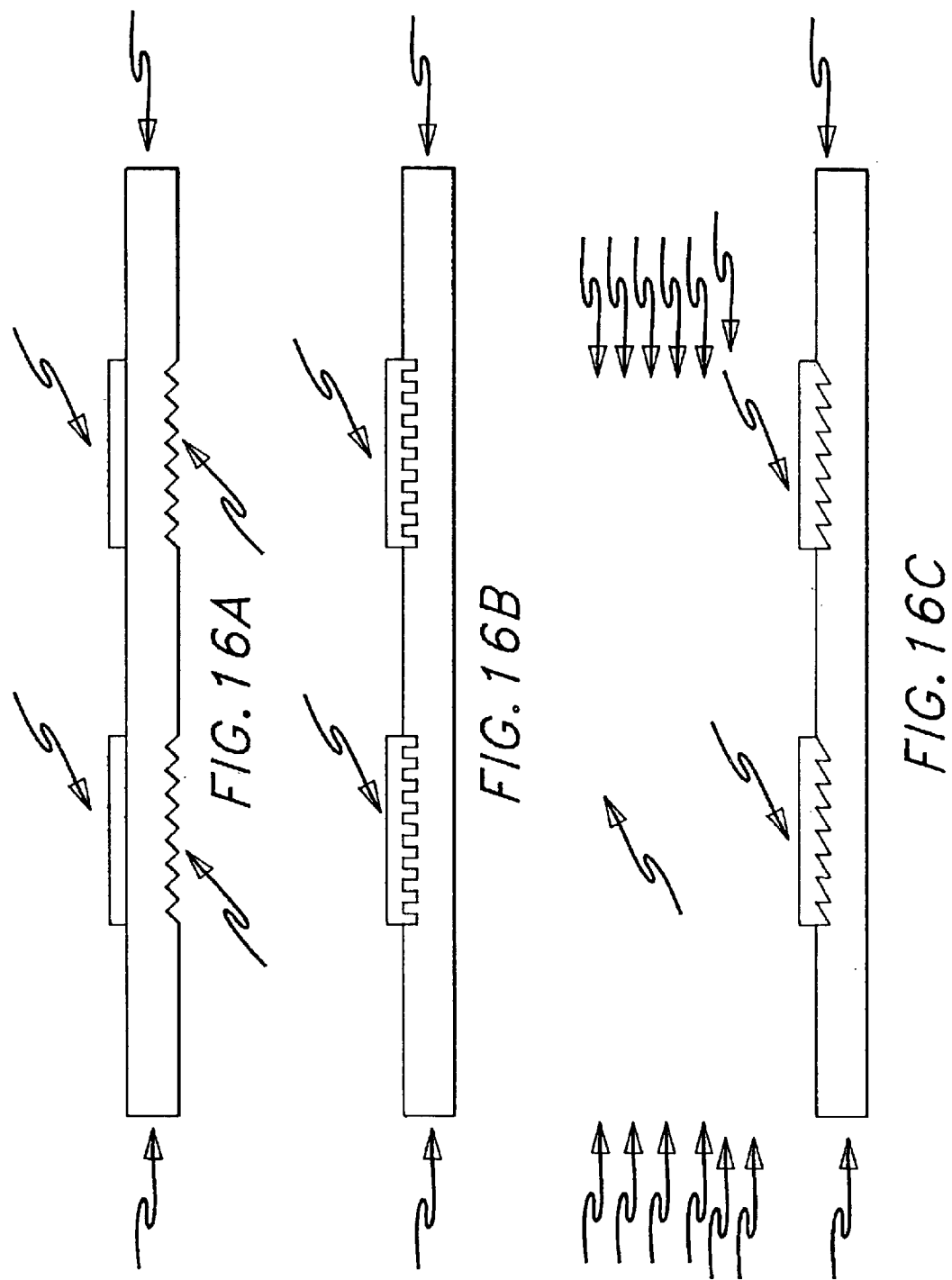

US 6,894,828 B2

POWER SCALABLE WAVEGUIDE AMPLIFIER AND LASER DEVICES

CROSS-REFERENCES TO RELATED APPLICATIONS

This patent application claims the benefit of U.S. Provisional Applications No. 60/236,638, filed on Sep. 29, 2000, and No. 60/259,681, filed on Jan. 4, 2001, each of which is incorporated herein by reference.

CONTRACTUAL ORIGIN OF THE INVENTION

The United States Government has rights in this invention under Contract No. N68335-00-C-0486 between the United States Department of Defense and Coherent Technologies, Inc., and certain Air Force contracts.

TECHNICAL FIELD

This invention is related generally to optical amplifiers and lasers and more specifically to power scalable amplifiers and laser devices based on self-imaging, all solid-state, multi-mode, waveguide technologies. The invention relates generally to the fields of wave guidance and beam transport. Specifically, the present invention relates to beam transport systems, and in some applications, to image and data transport systems and high power beam transport. More particularly, the invention also relates to guided wave systems and beam transport which may be particularly applicable to optical systems having high power requirements and desirable polarization and spatial, spectral, and temporal coherence characteristics. Embodiments of the present invention may also be applicable to other modes of wave guidance and beam transport, such as guidance and transport of various forms of transmitted electromagnetic energy or mechanical energy. The present invention may especially relate to self-imaging guided wave systems and beam transport. The invention may be particularly applicable to systems providing one or more potentially desirable features such as synthetic aperture, distributed aperture, beam forming, beam steering, beam combining, power sampling, power combining and power splitting, among other features. Specific fields to which the present invention may relate include telemetry, aeronautical and space applications, directed energy systems, object imaging systems, object positioning and tracking systems, detection systems, fiber optics, machine fabrication, and medical systems, among others.

BACKGROUND OF THE INVENTION

There are many potential applications for optical amplifiers and lasers that are efficient, low mass, and compact in size, yet can be scaled to high average powers while producing a high quality, near diffraction unlimited, beam. For example, laser beams are used extensively in industry for materials processing, cutting, and drilling applications and in medical surgical procedures in which very narrowly focused, high intensity beams produce sharper, cleaner cuts. A $TEM_{00}$ beam is one type of beam in which the light energy is spatially coherent (same phase across the thickness or cross-section of the beam) and is the lowest spatial mode of a laser. (Spatial mode in context of spatial coherency refers to the degree to which the laser is spatially coherent and should not be confused with modes of light transmission in a waveguide, which are also discussed herein.) A $TEM_{00}$ beam can be focused down to the smallest size—much more so than higher modes, thus concentrating the light energy in the beam to a high intensity. A $TEM_{00}$ beam can also be propagated for the longer distances with reduced beam spreading out in size. For many applications, therefore, it is desirable to pack as much energy as possible into $TEM_{00}$ beams. For example, for cutting materials, packing more energy into a $TEM_{00}$ beam means more power that can be focused to a very small spot to cut better, sharper, and cleaner than, a higher mode, e.g., $TEM_{01}$ or $TEM_{10}$, in which the light energy has even less spatial coherency of the light energy in the beam.

Laser light can also be used to detect range (distance away), speed and direction of travel, and even shapes or images of objects, such as targets, as described, for example, in U.S. Pat. No. 5,835,199. Range can be measured by transmitting (launching) short pulses (bursts) of laser light toward the object, e.g., target, from the range detector. When each pulse of light energy reaches the target, the light energy is reflected by the target. Unless the target is a high-quality mirror, the reflection scatters the light energy in many directions. However, a small portion of the reflected light energy will return to the range detector, where instrumentation can detect the reflection as well as the time it took for the pulse of light energy to travel from the range detector to the target and back, i.e., time of flight. Since the velocity (speed) of light is known, the time of flight can be used with the speed of light to calculate the range (distance) of the target from the range detector. If the target is moving in relation to the range detector, the reflected light energy will have a frequency change, known as the Doppler shift, which can also be detected in the small portion of light energy reflected back to the range detector. Such Doppler frequency shift can be used to determine the direction of travel and speed of the target in relation to the range detector. Such range and velocity (distance, speed, and direction) detection can only occur however, if the previously described small portion of the original light energy that gets reflected and returns to the range finder is still strong enough to be detected in the midst of all other light energy of similar wavelengths in the atmosphere (background noise), which also reaches the range detector. Of course, some of the light energy is also absorbed and dispersed by the atmosphere. Therefore, the more light energy there is in the pulse of light that reaches the target, the more likely it will be that enough light energy will be reflected by the target back to the range detector to be detectable and distinguishable against the background noise. A $TEM_{00}$ beam will propagate farther without spreading than any other mode (degree of spatial coherency), thus will keep the light energy concentrated in a smaller space than other modes. Consequently, a $TEM_{00}$ beam pulse will be able to deliver more of its energy to the target back to the range detector than other modes, which will enhance the likelihood that the return reflection of light energy from the target will be of sufficient amplitude (strong enough) to be detectable by the range detector.

The maximum range that can be measured, therefore, is determined, at least in part, by the energy contained within the pulse of laser light. As explained above, enough light energy has to be able to travel the full distance from the range detector to the target (surviving absorption, scattering, and other attenuation by the atmosphere), be reflected (surviving absorption and reflective scattering in other directions by the target), and return to the range detector (surviving still more absorption, scattering, and other attenuation by the atmosphere) and still be of larger amplitude than the background noise. The longer the pulse, i.e., the longer the laser is left turned "on", the more light energy there will be in the pulse. Therefore, to detect targets at the longest range (distance away), the shorter pulses with near diffraction limited, spatial coherency and near transform limited spectral content are often desired. However, if there are several targets or objects close to each other, the long pulse will not allow the range detector to distinguish between light energy reflected from the several targets or objects, respectively. For example, if the transmitted light energy in the pulse extends for 20 meters in length, the reflection will occur for the full 20 meters of the pulse and thereby produce a 20-meter reflection, which might be fine for one object or target. However, if one object or target is positioned only ten (10) meters apart from another object or target, the range detector would not be able to detect that there are actually two objects or targets spaced ten (10) meters apart from each other, instead of just one target or object. Such range discrimination, i.e., the minimum distance separating two reflective surfaces that can be detected separately, is even more critical in laser imaging applications in which the range detector must be able to discriminate between different reflecting surfaces of the same object or target in order to determine its shape. Such imaging along with range detection may be used, for example, to distinguish between an enemy tank and an adjacent house or to determine if an airplane has the shape of a commercial airliner or a military bomber.

Consequently, as a general rule, temporally short light energy pulses, i.e., low pulse widths, have better range or even shape discrimination capabilities, but the maximum range is often poor because of the low energy content that is technically practical in previous, state-of-the-art systems. Conversely, the wider the pulse, the higher the energy can be, and the longer the range, but, at the same time, the worse the range or shape discrimination will be.

For the example applications described above, as well as many more, it would be very beneficial to be able to provide higher power $TEM_{00}$ beams with compact equipment that is not subject to typical adverse, non-linear and thermal effects, which limit or degrade performance of current state-of-the-art high power laser resonators and high power optical amplifier devices. Such non-linear and thermal effects include thermal self-focusing and self-phase modulation, stress birefringence, stimulated Rayleigh, Raman, and Brillouin scattering, intermodel dispersion, and the like. Current state-of-the-art approaches to providing high power beams include, for example, using high-efficiency laser diodes to pump crystalline laser materials in the form of rods of slabs. Since the power from a single mode laser diode is currently limited to about one watt in state-of-the-art devices, large arrays of diode emitters are used to scale to higher powers. The poor spatial mode quality of diode arrays requires novel pump geometries to achieve sufficient overlap of pump and laser beams. A variety of laser diode coupling methods have been demonstrated, including lens ducts for end pumping [Camille Bibeau et al., "CW and Q-switched performance of a diode end pumped Yb:YAG laser," Adv. Solid State Lasers, vol. 10, 296 (1997)], side coupling into a diffuse pump chamber [S. Fiyikawa et al., "High-power high-efficient diode-side-pumped Nd:YAG laser," Adv. Solid State Lasers, Vol. 10, 296 (1997)], fiber-coupled diode arrays for longitudinal pumping, and direct transverse pumping in slab lasers [A. McInnes et al., "Thermal effects in a Coplanar-Pumped Folded-Zigzag Slab Laser," IEEE J. Quantum Electron Vol. 32, 1243 (1996) and references therein]. At high powers, it is difficult to achieve both excellent pump/mode matching with high pump absorption and diffraction-limited beam quality. Longitudinal pumping can result in excellent mode matching, but it is limited in power due to the thermal stress fracture limit, i.e., the medium will crack when it gets too hot [S. Tidwell et al., "Scaling CW Diode-End-Pumped Nd:YAG Lasers to high Average Powers," IEEE J. Quantum Electron, vol. 28, 997 (1992)]. One common problem in all these bulk laser geometries is thermal management—both in the form of heat extraction and dissipation and optical distortion due to thermal gradients. The heat build-up results from absorption of the high pump energy in a small volume of laser material, and active cooling in the form of bulky heat exchangers or refrigeration systems is usually required to remove the heat. Such active cooling adds severely to the size, weight, and power requirements of the system. Thermal gradients in the laser materials are manifested in the forms of undesirable thermal lensing or self-focusing, due to thermally-induced birefringence, which alters polarization of the light. See, for example, David Brown, "Nonlinear Thermal Distortions in YAG Rod Amplifiers", IEEE j. Quantum Electron, vol. 34, 2383 (1998). Considerable research has been devoted to compensation schemes for these adverse thermal effects. These problems are significant, because there is typically power dependent birefringence and bi-focusing. See, James Sherman, "Thermal compensation of a CW-pumped Nd:YAG laser", Appl. Opt., vol. 37, 7789(1998). One technique that has been tried to alleviate this effect is to use extremely thin laser media ("thin disks") such that thermal gradient is reduced and one-dimensional. See U.Branch et al., "Multiwatt diode-pumped Yb:YAG thin disk laser continuously tunable between 1018 and 1053 nm", Opt. Lett., vol. 20, 713 (1995). However, operation in quasi-three-level laser material (Yb, Er, Tm, Ho) severely exacerbates the thermal problem, since it requires much higher pumping to reach threshold and/or refrigerated cooling to depopulate the thermal laser level. Consequently, there has not been any real solution to the thermal problems when scaling bulk laser materials to high power levels.

Optical fiber lasers and amplifiers overcome some of the thermal problems of bulk laser crystal materials by greatly increasing the length of the gain medium and providing mode confinement, i.e., limiting the size of the fiber core diameter so that it can only propagate the lowest order eigenmode, (so-called "single mode fibers"—"mode" in this context not to be confused with spatial coherency modes discussed above and below). There are several benefits to this approach, including: (i) the long interaction length between the pump light and the laser beam lead to high gain and efficient operation, even in 3-level lasers in which the terminal laser level is thermally populated; (ii) Heat is distributed over a longer length of laser medium with a larger surface area, so the heat can be dissipated with passive conductive cooling to the atmosphere or to a heat sink; (iii) Operation can be restricted to a single transverse mode, which preserves a $TEM_{00}$ spatial coherence for the beam focusability and beam propagation with minimal beam spreading advantages as described above; (iv) The flexible nature of the optical fibers allows compact and novel optical designs; (v) The optical fibers can be directly coupled to other passive or active waveguides for modular functionality; and (vi) Fabrication is suited to large-scale production, which reduces costs. However, power scaling, i.e., scaling up to higher power levels, in such single-mode optical fibers is restricted by inability to make efficient coupling of pump light energy into the optical fiber and by the minute, single-mode core, (less than 10 $\mu$m diameter), which can only handle so much light energy without overheating and resulting in catastrophic facet (coupling surface) failure. The very small diameter, single-mode core size of a single-mode fiber has a very small numerical aperture (optical opening) through which light can be introduced into the fiber core, so high intensity, narrowly confined or focused pump light sources must be used.

This limitation of fiber lasers and amplifiers has been partly overcome by use of a double-clad fiber structure in which the small-diameter, single-mode core is surrounded by an inner cladding region, which, in turn, is surrounded by an outer cladding region. The inner cladding region has a larger numerical aperture than the core, thus can accept more pump light energy in more modes. Therefore, the pump light is optically confined to both the core and inner cladding regions together, while the optical beam (preferably a $TEM_{00}$ beam) is confined to the core alone. However, drawbacks of such double-clad fiber designs include: (i) The pump light energy, while introduced into, and confined by, the core and inner cladding together, is absorbed only in the core region so that the effective absorption coefficient is reduced by approximately the ratio of the core area to the inner cladding area; (ii) The inner cladding size is still very small, even though larger than the core, so that coupling of a laser diode array into the inner cladding region is still quite difficult and not very efficient; and (iii) The outer cladding region must be made with a much lower index of refraction than the inner cladding for optical confinement of the pump light to the inner region, and such lower index of refraction materials are often polymers (plastic), which are much more susceptible to damage than glass, especially from heat.

Essentially, the single-mode core diameter of optical fibers is so small (less than 10 $\mu$m, which is equivalent to $7.8 \times 10^{-7}$ $cm^2$ in cross-sectional area) that a 10 $\mu$J (micro joule) pulse of light has a fluence (energy per unit area) greater than 13 $J/cm^2$ (joules per square centimeter), which is close to the damage threshold of the fiber. Larger core diameter can handle more energy, of course, so that a 10 $\mu$J pulse of light would not be so close to the damage threshold, but larger core diameters result in undesirable eigenmode mixing and resulting loss of polarization, spatial coherence, and temporal coherence. Polarization is required for many beam input and output systems as well as beam splitting and analysis functions, and $TEM_{00}$ spatial coherence has the focusing and non-spreading spreading propagation benefits described above. Therefore, loss of polarization and spatial coherence are significant beam degradations that should be avoided. Some complex-design, large-area, multi-mode fibers have been reported with reduced mode-mixing and pulse energies up to 500 $\mu$J with $M^2 < 1.2$, where $M^2$ is a measure of divergence relative to diffraction limit and $M^2=1$ is diffraction limited, have been reported [see, e.g., H. Offerhaus et al., "High-energy single-transverse mode Q-switched fiber laser based on multimode large-mode-area erbium-doped fiber", Opt. Lett., vol. 23 (1998)], but no truly single mode ($LP_{01}$) fiber design has been able to break the 1 mJ (1,000 $\mu$J) barrier, while maintaining spectral and spatial coherence with short temporal pulse widths.

In some applications, production and amplification of high-power, high quality laser and other light beams is only part of the problem. Transporting such high-power, high-quality beams to points of application, such as the industrial cutting and materials processing, medical, laser radar ranging, imaging, and tracking applications mentioned above, can also present heretofore unsolved problems. For example, in laser radar (ladar) system described in U.S. Pat. No. 5,835,199, a high-power laser beam is produced for launching from airplanes or other platforms for ranging, imaging, and tracking objects or targets as much as twenty miles away or more. In an airplane, the most effective launch point for such high-power beams may be in the nose cone of the airplane. However, the nose cone is usually small, and there are also many electronic and other kinds of equipment that also have to fit there. Consequently, it is often not possible to place the high power beam production and amplifying equipment described in U.S. Pat. No. 5,835,199 at the most effective launch location in the airplane. It would be very beneficial to have some way of transporting only the high power beam from some other location in the airplane to a launch point in the nose cone without degrading beam power, quality, polarization, and the like.

Similar beam transport capabilities would also be beneficial in industrial, medical, imaging, directed energy, and other applications of high power laser and other light beams, where space is limited or where it would just be more convenient to place a high powered, high quality beam without all the associated beam production and/or amplification equipment.

Yet, transport of high power, high quality laser beams without degradation of beam power, quality, temporal and spatial coherence, polarization, and the like presents serious problems with many of the same kinds of obstacles as described above for the beam production and amplification. For example, single mode waveguides, such as single mode optical fibers, can maintain beam quality, but are very limited in power transport capabilities. It is not uncommon for industrial medical, and even imaging applications to require continuous wave (cw) output power of 100 watts or more, while even higher power laser applications, such as Q-switched or pulsed lasers, may have output power in the megawatt range, such as 10 megawatts or greater. Single-mode fibers and waveguides are simply unable to handle that kind of optical power or light energy.

Multi-mode fibers and other waveguides can transport more power, but they do not maintain spatial coherence, polarization, and the like, because of multi-mode interference and other reasons mentioned above. Free-space light transport has its own problems, not the least of which is that the light paths have to be unobstructed and alignment and stability problems in non-laboratory environments are extremely difficult to overcome and are often insurmountable.

Techniques have been previously developed to actively compensate for finite length circular fiber spatial mode deficiencies, potentially including SBS phase conjugation, but these techniques are limited in scope to narrow spectral linewidth lasers to match the SBS gain bandwidth, enough optical power to provide the nonlinear drive field required and wavefronts that are not fully randomized. Furthermore, and as previously mentioned, it may be desirable in many waveguide applications to maintain polarization. In circular fibers with a uniform index-of-refraction in both the core and cladding, polarization may not be maintained. To preserve polarization, special polarization-maintaining fiber designs may be required which essentially create an asymmetric index difference in orthogonal directions. If this index profile is disturbed, potentially as a result of high power operation, the polarization integrity may drift or be lost.

Previous attempts may have been made to incorporate traditional self-imaging techniques for low power waveguide systems to potentially preserve beam quality. The concept of self-imaging, generally, may have been derived in accordance with traditionally known physical observations. According to one such observation, it has been demonstrated generally that if a plane wave illuminated a planar phase or amplitude grating, such as a Ronchi grating, that the grating would periodically spatially re-image without the use of lenses. The imaging period along the propagation axis is generally referred to as the Talbot distance:

$$D_T = 2 n a^2/\lambda \quad (1)$$

where n is the index of refraction, a is the waveguide width, and λ is the wavelength of light in a vacuum. However, such application of Talbot self-imaging may not have been heretofore properly applied for high-power waveguide systems.

U.S. Pat. Nos. 3,832,029 and 4,087,159, hereby incorporated by reference, may provide self-imaging techniques for low power, image-forming waveguide systems and particular configurations of waveguides for self-imaging. However, both systems may suffer from draw backs related to high power operations. The potential incorporation of such waveguide systems into high-power applications such as laser applications, and directed energy systems, object imaging systems, object positioning and tracking systems, detection systems, fiber optics, machine fabrication, and medical systems, generally, may result in potential optical damage to the waveguide and nonlinear optical effects, as previously described, as such previous systems appear not to accommodate for high power operations. Additionally, a potential long felt but unmet need may have existed in relevant fields regarding the resolution of beam quality and high power application aspects for waveguide systems, wherein the efforts described in U.S. Pat. Nos. 3,832,029 and 4,087,159, and potentially other previous attempts, may have failed to even address such operations. Therefore, such waveguide systems may actually teach away from the incorporation of self-imaging techniques and particular configurations of waveguides in high-power waveguide and beam transport techniques.

Beam quality issues may arise, for example, related to mode mixing as previously described, or with regard to "bend, buckle and twist" of the waveguide and potentially resulting modification of at least spacial coherence, wherein, for example, a twist of the waveguide may optically result beam formation potentially equivalent to a negative lens, and a bend in the waveguide may result in beam formation potentially equivalent to a positive lens. Such applications of waveguide technology have not been adequately addressed in the past attempts previously described or in other previous beam transport technologies.

SUMMARY OF THE INVENTION

Accordingly, it is an object of the present invention to provide an optic amplifier or laser resonator that can be operated at much higher optical powers and Q-switched pulse energies than is possible in single-mode waveguides or fibers, while: (i) also having many of the excellent benefits of single-mode waveguide or fiber amplifiers and lasers, including preservation of polarization and capability of maintaining a TEM$_{00}$ (Gaussian) beam profile (or any other desirable waveform); and (ii) avoiding undesirable nonlinear effects that are inherent in single-mode waveguide or fiber amplifiers and lasers operated at higher intensities, such as stress birefringence and self-phase modulation.

Another general object of the present invention is to provide an apparatus and method for producing high power continuous wave (CW) laser beams that are capable of maintaining a TEM$_{00}$ (Gaussian) wavefront for sharp focusing capabilities in industrial materials processing and fabrication, medical surgical applications, and any other application in which sharp focusing of high power beams would be beneficial.

Another general object of the present invention is to provide an apparatus and method for producing high power, pulsed laser beams for packing higher energy into shorter pulses for longer ranging and higher resolution target acquisition and imaging applications.

Another object of the present invention is to provide a high power optical amplifier or laser resonator that has efficient heat dissipation and that can be mated easily and effectively to a heat sink.

Still another object of the present invention is to provide a high power, yet compact and lightweight optical amplifier or laser resonator.

A further specific object of the present invention is to provide a high power quasi-continuous-wave (QCW) or high repetition rate macro-pulse laser which can be frequency converted to Band IV for defense infra-red countermeasure applications A still further specific object of the present invention is to provide a few HZ to <100 MHz repetition rate laser source that can be pumped efficiently quasi-cw or low cost, continuous wave, diode laser and which can be frequency converted to eye-safe wavelengths for target identification and ranging and unconventional active imaging architectures.

Another specific object of the present invention is to provide a method of frequency shifting and/or amplifying a guided wave through 3 or 4 wave mixing processes (such as Raman amplification or parametric wave mixing).

Another specific object of the invention is to provide a method for stabilizing an internal propagating mode by compensating linear or non-linear dispersion terms (e.g., achromatization and soliton formation by using linear or non-linear, e.g., intensity dependent, index of refraction media in the waveguide core.

A more specific object of the present invention is to mitigate undesirable effects of thermal focusing in high power optical amplifiers so that one waveguide design can be used for various average powers and pulse formats for a variety of applications, thereby making it feasible for one design to span many applications.

Another object is to provide spectral and spatial coherence control that is adequate for use of waveguides, both hollow and solid, e.g., dielectric, beam transport, and especially directed energy applications such as high power weapon applications as elements of a phased array. This is typically defined as near diffraction limited wavefronts with optical phase control to less than one-tenth of a wave.

Another specific object of the present invention is to provide low cost and efficient coupling of laser diode arrays into an active optical amplifier medium or laser resonator for high conversion efficiency.

Still another specific object of the present invention is to provide a high power scalable optical amplifier or laser resonator that has excellent pump light to beam overlap and high energy extraction efficiency.

Yet another specific object of the present invention is to provide a high power optical amplifier or laser resonator in which the active medium has non-dielectrious thermal gradients while pump light energy is distributed over a large volume and surface area.

Another general object of the present invention is to provide guided wave systems and beam transport providing desirable capability for high power applications. It is a goal of the present invention, therefore, to provide guided wave systems, beam transports, or waveguides that provide for particular beam types, particular output power requirements of desirable waveguide and beam transport applications, and desirable levels of beam quality.

Yet another object of the present invention is to provide self-imaging guided wave systems and beam transport while achieving desirable levels of beam quality and capability for high power applications. It is one goal of the present invention, therefore, to provide guided wave systems and beam transport providing desirable polarization and spatial, spectral, and temporal coherence characteristics. Furthermore, it is a goal of the present invention to provide self-imaging guided wave systems and beam transport while minimizing or eliminating potential optical damage to the waveguide and nonlinear optical effects.

Still another object of the present invention is to provide guided wave systems and beam transport that may be applicable, and potentially comprise, one or more potentially desirable beam transport features. A corresponding goal, therefore, is to provide guided wave systems and beam transport that may be applicable, and potentially comprise, one or more features such as synthetic aperture, distributed aperture, beam forming, beam steering, beam combining, power sampling, power combining and power splitting, among other features.

A further object of the present invention is to provide guided wave systems and beam transport that may be applicable to one or more fields, including telemetry, aeronautical and space applications, directed energy systems, object imaging systems, object positioning and tracking systems, detection systems, fiber optics, machine fabrication, and medical systems, among others.

Yet another object of the present invention is to provide guided wave systems and beam transport that are adapted to aeronautical applications, and aircraft applications. A goal of the present invention, therefore, is to provide guided wave systems and beam transport comprising a configuration particularly directed to directed energy systems, object imaging systems, object positioning and tracking systems, and detection systems for aircraft and other aeronautical and space applications, while maintaining desirable beam quality and high power characteristics. A further related goal is to provide for "bend, buckle and twist" characteristics of the guided wave systems and beam transport and potentially resulting modification of at least spacial coherence and application thereof.

Additional objects, advantages, and novel features of the invention are set forth in part in the description that follows and will become apparent to those skilled in the art upon examination and understanding of the following description and figures or may be learned by the practice of the invention. Further, the objects and the advantages of the invention may be realized and attained by means of the instrumentalities and in combinations particularly pointed out in the appended claims.

To achieve the foregoing and other objects and in accordance with the purposes of the present invention, as broadly embodied and described herein, the high power optical amplifier of this invention may comprise an optic amplifier for a laser beam and/or a laser resonator that includes a multi-mode, self-imaging rectangular, waveguide with a core comprising a gain medium, which can be excited or pumped with energy and can impart such energy to a light beam propagating through such waveguide core. The amplifier or laser resonator includes optical components that focus or otherwise provide a desired beam spatial profile on a face or aperture of the rectangular waveguide, and the waveguide length coincides with a waveguide self-imaging period (WSIP) of the rectangular waveguide or some non-zero, integer multiple thereof, in order to produce that same spatial profile in an amplified output beam. The multi-mode, rectangular, waveguide core may be unclad, clad in rectangular cladding, which is particularly beneficial for heat sink mountings, electrical excitation, and optical pumping with elongated, stacked laser diodes, or clad in optical fibers. A zig-zag waveguide optical path, which increases effective energy extraction in a smaller overall length, is particularly adaptable to one-dimensional, or quasi-one-dimensional, multi-mode waveguide cores according to this invention.

Embodiments of the invention may also comprise passive, hollow and dielectric core multi-mode, guided wave, beam transport systems. Embodiments may include rectangular cross-section waveguides, and preferably maintaining spatial profile of an input beam, such as a Gaussian or super-Gaussian beam, through the self-imaging period of the waveguide. Additional aspects of the present invention may be provided either separately or in conjunction with the self-imaging guide of the present invention; for example, transport, amplification, phase/frequency control or modulation, deflection, conversion, synthetic aperture, distributed aperture, beam forming, beam steering, beam combining, power sampling, power combining and power splitting, among other features. Embodiments of the present invention may provide a self-imaging, multimode waveguide as disclosed and claimed herein, and self-imaging guided wave systems and beam transport. Embodiments of the present invention may further provide a method of self-imaging, multimode beam transport, as disclosed and claimed herein, and other self-imaging wave guidance techniques. Other embodiments of the present invention may also be disclosed and claimed herein.

BRIEF DESCRIPTION OF THE DRAWINGS

The accompanying drawings, which are incorporated in and form a part of the specification, illustrate the preferred embodiments of the present invention, and together with the descriptions serve to explain the principles and enabling embodiments of the invention.

In the Drawings

FIGS. 16(a–c) are diagrammatic view of waveguide embodiments providing three embodiments of wall output coupling, in accordance with the present invention;

DETAILED DESCRIPTION OF THE INVENTION

The basic concepts of the invention may be embodied in many different systems and techniques. The inventive concept may involve the materials, elements, apparatus, device and methods regarding guided wave systems, beam transport and waveguides variously, and in combination and subcombination of elements and features thereof. While one preferred embodiment of the invention may be directed to one or more waveguide embodiments and methods thereof, the broad concept of the invention should be construed as a disclosure of guided wave systems and beam transport in general, and as indicated, to various fields of endeavor. Importantly, as to all of the foregoing, all aspects should be understood to be encompassed by this application, both independently and in combination as set forth in the written description and drawings that follow, as well as set forth in the claims presented or later issued, in both this and subsequent related or continuing applications, if any.

Figure 1:
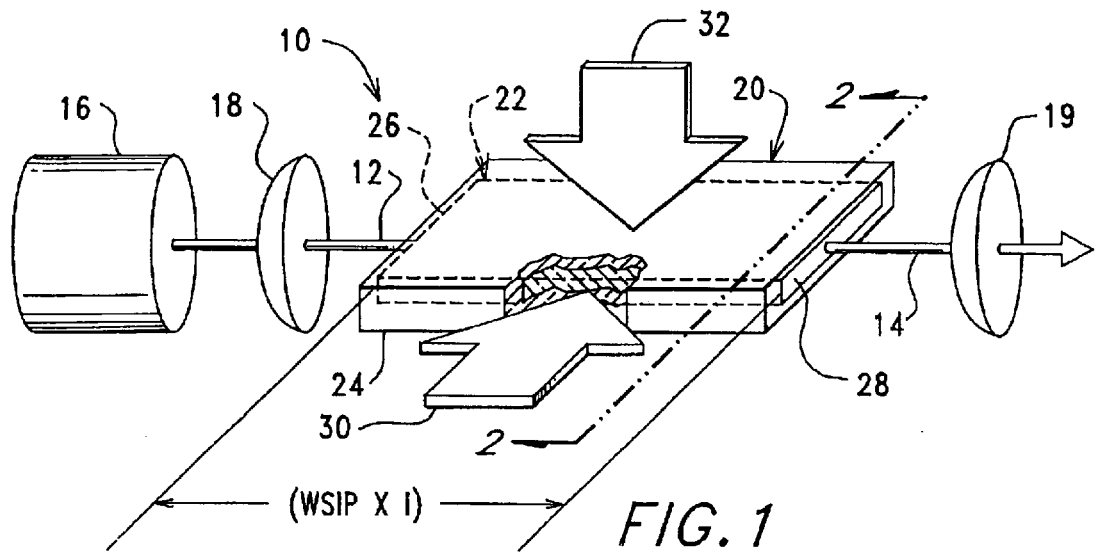
FIG. 1 is a diagrammatic, isometric view of a single-pass high power optical amplifier of this invention with a portion of the rectangular, multi-mode waveguide cut away to reveal the core and cladding structure.

A multi-mode, high-power, optic amplifier 10 according to this invention is illustrated diagrammatically in FIG. 1 in a single-pass embodiment. An important feature of this invention is the use of a multi-mode, rectangular, self-imaging waveguide 20 as the gain medium for the high-power, optical amplifier 10, so that the amplifier 10 can deliver a high power beam with a wide range of spatial profile modes up to the spatial frequency limit of the input aperture as defined by its optical transfer function, such as the highly desirable $TEM_{00}$ mode with a Gaussian amplitude and phase distribution, without being confined in power through-put by the constraints of a single-mode waveguide.

More specifically, the internal dimensions of a multi-mode wave guide core, including the smaller dimension width or thickness (a) (see FIG. 2), are large enough to support multiple eigenmodes of light propagation, as opposed to being so narrow as to support only one light propagation eigenmode as in a so-called single-mode waveguide. Accordingly, for purposes of this invention, a multi-mode waveguide is one that does not restrict light propagation to only one mode in a dimension. Thus, a single-mode waveguide is not considered to be included in the scope of the term multi-mode. Therefore, any input beam 12, including a $TEM_{00}$ Gaussian beam, will quickly break up into as many eignemodes of propagation as allowed by the multi-mode waveguide 20 size and shape, and such number of eigenmodes is more than one. Each light propagation mode has a different path through the waveguide and travels a different distance from the entrance face 26 to the exit face 28 than other modes, so the multiple modes mix and interfere with each other, which degrades beam quality and quickly destroys the Gaussian distribution and the spatial coherence of the entering $TEM_{00}$ beam 12 or of any other entrance beam spatial profile.

However, according to a well-known re-imaging characteristic of rectangular waveguides, the optical interference patterns in the waveguide re-phase and reconstruct an input image at periodic distances along the waveguide. The distance for such periodic re-imaging, sometimes called the waveguide self-imaging period (WSIP) and sometimes symbolized as $D_w$, is related to the index of refraction (n) of the waveguide propagation medium, the width or thickness (a) of the waveguide propagation medium, and the wavelength ($\lambda$) of the light being propagated. In general, $WSIP=4na^2/\lambda$, although in the special case where the beam is perfectly symmetric with respect to the center of the waveguide, i.e., the beam profile is identical with its mirror image, $WSIP=na^2/\lambda$. See, e.g., Bryugdahl, J. Opt. Soc. Am 63, 416 (1973); Ulrich, R. and Aukele, G., Appl. Phys. Lett., 27, 337 (1975).

This invention utilizes that re-imaging principle of rectangular waveguides to construct the high-power optic amplifier 10 in a manner that can deliver a high-power output beam 14 with a desired spatial profile, for example, a $TEM_{00}$ mode Gaussian beam. The input beam 12 is injected at an entrance face 26 into the rectangular, multi-mode waveguide 20, which has a core 22 comprising an optical gain medium or ¾-wave mixing medium, i.e., a material that can be excited or populated with additional energy that then gets added to the light energy in a beam that passes through the material (hereinafter sometimes referred to generally as a gain or mixing medium). Therefore, the input beam 12, upon entering the multi-mode waveguide core 22, breaks into as many eigenmodes as the width or thickness (a) of the waveguide 20 will allow, while it gets amplified, with the additional energy. Input of the additional energy to the core 22 e accomplished with any of a number of well-known techniques, which are symbolized generically by the energy input arrows 30, 32 in FIG. 1. Therefore, while the multi-mode propagation of the light beam degrades in beam quality as various modes of propagation mix and interfere in the waveguide 20, the light beam never-the-less gets amplified with additional energy acquired from the gain medium of the core 22. However, according to the re-imaging characteristic of rectangular waveguides described above, the input spatial profile of the beam is reproduced periodically at specific distances of propagation, i.e., WSIP=$4na^2/\lambda$ (or WISP=$na^2/\lambda$ in the symmetric case), and such reproduction of the desired spatial profile occurs even though the beam is amplified with additional energy acquired from the gain medium of the core 22. Therefore, the exit plane 28 of the multi-mode, rectangular waveguide core 22 is positioned, according to this invention, to coincide with a re-imaging plane of the waveguide 20, i.e., at some positive, non-zero integer (i) multiple of the waveguide self-imaging period (WSIP). Consequently, the length of core 22 of the waveguide 20 extending between the entrance face 26 and the exit face 28 is equal to WSIP×i, where i a positive, non-zero integer, such as 1, 2, 3, . . . , etc. The result is an amplified output beam 14 at the exit face 28 with the same spatial profile as the input beam 12 at the entrance face 26.

Since the cross-sectional area of the core 22 of a multi-mode waveguide 20 can be so much (orders of magnitude) larger than the cross-sectional area of a single-mode waveguide (not shown) the energy inputs 30, 32 and resulting beam amplification in the optical amplifier 10 can be much greater than would be possible in a typical single-mode waveguide optical amplifier. Yet, the highly amplified output beam 14 of the high-power optical amplifier 10 of this invention can retain the desired input beam 12 spatial profile, for example, a $TEM_{00}$ mode Gaussian profile.

Further, the ability to use a much larger cross-sectional area for the core 22 of the multi-mode, rectangular optical amplifier 10 of this invention accommodates much higher power amplification capabilities without the adverse non-linear effects of, such as Brillouin scattering thermal effects, stress effects, and self-phase modulation, which are typically encountered in single-mode waveguide amplifiers. The superior thermal management also mitigates stress birefringence, which otherwise degrades polarization of the propagating light beam, and self-phase modulation degrades temporal and spatial coherency of the beam. Therefore, the ability to provide high-power optical amplification with the amplifier 10 of this invention, while strongly mitigating the adverse effects of stress birefringence and self-phase modulation enables the amplifier 10 to produce a high intensity output beam 26 that not only retains temporal and spatial coherence of the input beam 12, but that also retains any polarization of the input beam 12, which is important for many signal processing, beam steering, industrial cutting, and other applications of high intensity laser beams.

The beam source 16, input lens 18, and output lens 19 shown in FIG. 1 are shown only to illustrate, in a symbolic manner, atypical optical input/output arrangement for an optical amplifier and are not intended to be limiting or instructing in any way, since persons skilled in the art are well aware of, and capable of providing, myriad such input/output systems and configurations. Suffice it to say that operation of the amplifier 10 requires an input beam 12 from some source 16, which could be a laser diode or any other light beam producing apparatus or simply a light beam being transmitted by an associated system, such as a free-space system, optical fiber, or other wave guide propagated beam that is to be coupled into, and amplified by, the amplifier 10 of this invention. The input lens 18 is symbolic of any optical components or system that conditions and/or focus the input beam 12 with the desired spatial profile on the aperture or entrance face 26 of the core 22. An output lens 19 is not really required for an amplifier 10, but is shown here only as symbolic of any myriad optical components or system that may be used to couple the amplified output beam 14 to optic other devices or to project the amplified output beam 14 into free space.

The large cross-sectional area of the core 22 also accommodates a wide variety of energy input or pumping systems, which are indicated symbolically in FIG. 1 by arrows 30, 32, and from any side or end of the core 22, as will be described in more detail below. For example, the gain medium of core 22 can even be optically pumped by poor beam quality optical sources, such as a broad-stripe laser diode emitter or array coupled into a lateral side of the waveguide 20, as indicated by arrow 30, since the pump beam does not have to be focused into the entrance aperture or face 26, as would be required for a single-mode waveguide.

Optical confinement in the multi-mode, rectangular, waveguide 20 can be provided by any of myriad well-known waveguiding techniques. For example, total internal reflection by a cladding 24 with a lower index of refraction than the core 22 is one typical waveguiding technique, as is reflective surfaces on waveguide walls (not shown in FIG. 1).

Opposing waveguide walls do not have to be strictly parallel, although so-called tapered waveguides would have continuously variable imaging periods. Therefore, there would be more than one WSIP for a tapered waveguide. Consequently, placement of an exit face 28 at some integer multiple of one WSIP, as described above, might miss at a re-image plane, thus would not be appropriate or effective. However, by knowing any particular degree of taper, the location of a re-image plane can be determined, and the exit face 28 can be positioned in such a re-image plane according to this invention. Therefore, use of a tapered waveguide with a rectangular cross-section for a beam amplifier and positioning the exit face at any re-image plane is considered to be equivalent and part of this invention, even if the exit face position is not at an integer multiple of a WSIP in a tapered waveguide embodiment.

The waveguide core 22 can comprise any gas, liquid, or solid gain medium. Essentially, a gain or mixing medium is a material that can impart energy to a light beam that propagates through it. Since many such gain or mixing media are well-known to persons skilled in the art, it is not necessary to further explain or describe them for an understanding of this invention. Several examples will suffice, such as yttrium aluminum garnet doped with neodymium Nd:YAG, Nd:YLF or homologous materials, AlGaAs, InGaAsP, or various semiconductor materials, Nd-doped phosphate glasses, or $CS_2$, which is a liquid.

Figure 2:
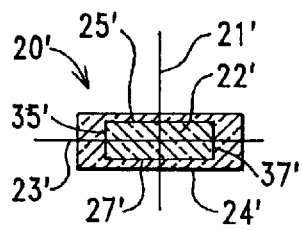
FIG. 2 is a cross-section view of large aspect-ratio rectangular or "one-dimensional" waveguide taken substantially along section line 2—2 of FIG. 1.

The quasi-one-dimensional, rectangular waveguide 20 geometry illustrated in FIGS. 1 and 2 is particularly attractive for high-power waveguide applications, since aperture area of the entrance face 26 can be over 10,000 times larger than that of a typical single-mode optical fiber, which allows for high-power operation of the amplifier 10 of this invention at intensities and fluences that are well below the threshold for optical damage and nonlinear optical effects in the waveguide 20, while still maintaining polarization and beam spatial profile, as discussed above. The potential for power scaling, i.e., high-power operation, is proportional to the waveguide aperture area at the core face 26, which, as mentioned above, is not restricted in this multi-mode, rectangular waveguide 20 by typical single-mode aperture constraints. Additionally, the quasi-one-dimensional waveguide 20 geometry of FIGS. 1 and 2 is particularly attractive for high-power waveguide amplifier applications, since this geometry has: (i) an end or side aperture that can be mode-matched to one or more laser diode arrays allowing optical pumping with high coupling efficiency, which will be described in more detail below in relation to FIG. 8; (ii) a high surface-to-volume ratio for efficient heat dissipation, as will also be described in more detail below in relation to FIG. 8; and (iii) low thermal gradients that are essentially one-dimensional due to thin waveguide 20 geometry. For example, a 1-cm×100-μm rectangular aperture is an excellent match to a 1-cm×1-μm laser diode array for high coupling efficiency of the laser diode output to the waveguide. A quasi-one-dimensional waveguide 20 geometry, sometimes simply called "one-dimensional" for short, is generally considered to be one in which there is self-imaging waveguiding in the direction of only one transverse axis 21 and simply free-apace propagation along the unguided direction or transverse axis 23. In other words, the waveguide width or thickness (a) along one transverse axis 21 (the distance between core/cladding interfaces 25, 27) is much smaller than the width along the other transverse direction or axis 23 (the distance between core/cladding interfaces 35, 37. When there is enough difference between the direction 21 width or thickness and the direction 23 width or thickness so that the beam width in the core 22 is always smaller than the 23 direction width, and when the beam divergence along the short axis 21 is large enough compared to the waveguide width in the direction of axis 21 that the beam spreads and reflects from interfaces 25, 27 causing imaging along axis 21, the waveguide 20 is considered to be quasi-one-dimensional. In other words, if the length of the waveguide is such that self-imaging obtains in one direction and free space propagation describes the other direction, then quasi-one-dimensional waveguides are appropriate.

Figure 3:
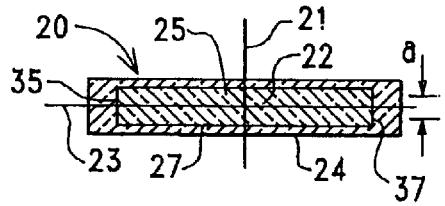
FIG. 3 is a cross-section view of a rectangular, multi-mode waveguide similar to FIG. 2, but with the aspect ratio smaller or "two-dimensional" so that the sides are also effectively optically confined by the cladding.

A two-dimensional, rectangular waveguide 20 cross-section is shown in FIG. 3. The core 22' is surrounded by a reflective cladding 24' to confine the light beam to the core region 22'. The cladding 24' can be, for example, a medium of lower index of refraction than the core region 22', for achieving total internal reflection. It could also be a medium of intrinsic reflectivity at the beam propagation wavelength, such as metal, air, vacuum, or one or more dielectric coatings that reflect the propagation wavelength. Reflections along one transverse direction or axis 21' occur at the opposite core/cladding interfaces 25', 27', while reflections along the other transverse direction or axis 23' occur at the opposing waveguide interfaces 35', 37'. The waveguide self-imaging period (WSIP) from each set of opposing waveguide interfaces 25', 27' and 35', 37' will be different, if the rectangular core 22 cross-section is not a square. On most applications, it is desirable that the re-phasing or re-imaging distances (WSIP×i) for the two waveguide axes 21' match at the waveguide aperture or faces. However it may be useful in certain situations to have one of the waveguide axes be at a "fractional Talbot distance" in order to split the exit beam into multiple, power-divided replicas of the input beam.

Figure 4:
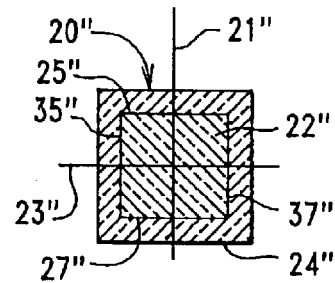
FIG. 4 is a cross-section view similar to FIG. 2, but illustrating a square waveguide core, which is a special case of a rectangular waveguide.

An illustration of a square cross-section waveguide 20" is shown in FIG. 4. In this embodiment, the waveguide width along its vertical axis 21", i.e., the distance between core/cladding interfaces 25", 27", and the width along horizontal axis 23", i.e., distance between core/cladding interfaces 35", 37", are equal. Therefore, the waveguide self-imaging period (WSIP) relative to each of these axis 21", 23" is the same.

References herein to rectangular waveguides and rectangular apertures apply to square cross-sections and square apertures as well as to one-dimensional or quasi-one-dimensional waveguides or apertures, unless otherwise noted and any of which may be rigid structures, slabs, ribbons, thin films, and parallepiped and other self-imaging structures. Also, apertures refer to the end faces, e.g., entrance and exit faces 26, 28 (FIG. 1) of the core 22, which are essentially the surfaces or optical "openings", where light beams 12, 14 enter and exit the core 22.

The high-power optical amplifier 10 of this invention shown in FIG. 1 and described above is just one simple embodiment illustrating the use of a multi-mode, rectangular, re-imaging waveguide with a core comprising a gain or mixing medium for amplifying a light beam or mixing with other beams. There are, of course, many other useful amplifier configurations and embodiments that will occur to persons skilled in the art, once they understand the principles of this invention. For example, a double-pass optical amplifier embodiment 40, in which the light beam 42 being amplified is passed twice through the multi-mode, rectangular waveguide 50 to thereby extract even more energy from the gain medium in the waveguide core 52. In this example, the gain medium that comprises the core 22, such as Nd:YAG, is pumped with light energy 64 with, for example, a laser diode 58 coupled into the core 22 by a lens focusing system 59, which focuses the light 64 produced by the laser diode 58 onto the end face of aperture 56 of the core 52. The end face 56 is coated or covered with a dichroic material or combination of materials 66 that is highly transmissive of the wavelength of light 64 produced by the laser diode, but highly reflective of the light 42 that is to amplified. Such dichroic materials 66 are well-known in the art and will be selected based on the wavelengths of the pump light 64 and the input beam 42.

The input beam 42 follows the same path 42 into and out of the waveguide 50, so the amplified output beam 44 has to be separated from the input beam 42. A common, well-known system for combining an input light beam 42 and output beam 44 of the same optical path 43 and then separating them includes a polarizing beam splitter 45, which comprises a layer of material 56 that reflects light that is polarized in one plane, e.g., the s-polarization plane, and transmits light that is polarized in the orthogonal plane, e.g., the p-polarization plane. Thus, the input beam 42, in this example, may be s-polarized so that the polarization selective layer 46 in the beam splitter 45, reflects the input beam 42 into the optic path 43, which is aligned with the face or aperture 58 of the waveguide core 52. A birefringent, ¼-wave retarder 47 is positioned in the beam path 43, so that the reflected input beam 42 has to pass through the ¼-wave retarder 47 on its way to the waveguide 50. The ¼-wave retarder 47 converts the s-polarization of the input beam 42 to circular polarization. The lens system 49 focuses the input beam 42 onto the aperture or face 58 of the core 52, again, with whatever spatial profile is desired, e.g., a $TEM_{00}$ or Gaussian profile.

As the input beam 42 propagates through the gain medium of the core 52 of the multi-mode waveguide 50, it breaks into as many modes of propagation as the size of the rectangular core 52 permits, and it acquires or extracts energy from the gain medium in the core 52 that is supplied by the pump light 64, thereby being amplified. At the same time, as described above, the rectangular waveguide periodically reconstructs or re-images the input beam spatial profile that is focused by the lens system 49 onto the aperture or face 58 at non-zero, positive integer (i) multiples of the waveguide self-imaging period (WSIP), i.e., at WSIP×i. Therefore, as described above, the apertures or faces 56, 58 of the core 52 are positioned at locations that coincide with re-image planes and spaced apart from each other by a distance equal to WSIP×i. The reflecting surface 56 could also be at a fraction of a WSIP distance as long as the total distance between faces 56, 58 and back again is WSIP×i. Upon reaching the end face 56, the amplified input beam 42 is reflected by the dichroic coating material 66 for another pass back through the core 52, where it continues to acquire or extract even more energy from the gain medium of the core 52. Therefore, the beam is amplified again on this second pass through the core 52. Again, with proper spacing of the faces 56, 58, the twice amplified beam is re-imaged at face or aperture 58 with the same spatial profile as it had when it entered aperture or face 58. Therefore, the amplified output beam 44 has the same spatial profile as the input beam 42, according to this invention.

Again, the amplified output beam 44 emanates from the waveguide 50 along the same optical path 43 as the input beam 42, so it has to be separated from the input beam 42 in order to direct it to whatever application (not shown) for which it is amplified. Such separation is accomplished by the ¼-wave retarder 47 and polarizing beam splitter 46. Since one of the attributes of this invention is that the light beam maintains its polarization as it gets amplified in the multi-mode, rectangular waveguide 50, it emerges from the aperture or face 58 with the same circular polarization that was imparted to the input beam 42 by the ¼-wave retarder 47, as described above. Upon re-passing back through the ¼-wave retarder 47, the polarization of the light beam is rotated again to polarization in the p-polarization plane, which is orthogonal to the s-polarization plane fo the input beam 42. Therefore, the now p-polarized output beam 44 is transmitted, instead of reflected, by the polarization selective layer 46 in polarizing beam splitter 45, and it emerges from the polarization beam splitter 45 on a different output path than the path of the input beam 42. Of course, persons skilled in the art will recognize that an input beam with p-polarization and the output beam with s-polarization can also be used to the same effect, and there are other suitable optic arrangements for feeding input beams into and extracting output beams from state-of-the-art optic amplifiers and other optic components that would work with the multi-mode, rectangular, self-imaging waveguide amplifier of this invention.

Figure 5:
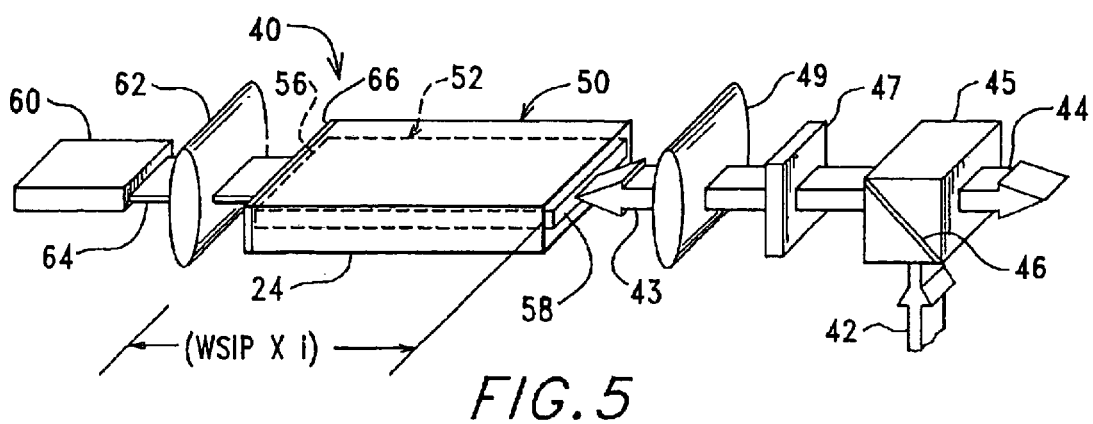
FIG. 5 is a diagrammatic, isometric view of a double-pass, high-power optical amplifier of this invention with a reflective end face.
Figure 6:
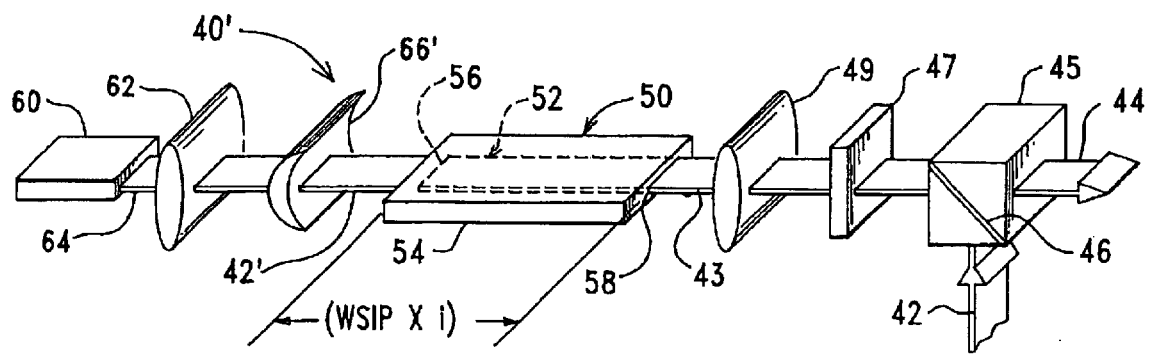
FIG. 6 is a diagrammatic, isometric view of a double-pass, high-power optical amplifier similar to FIG. 5, but with an external end reflector.

The double-pass amplifier embodiment 40' shown in FIG. 6 is similar to the FIG. 5 amplifier embodiment 40 and described above, except that a curved, dichroic mirror 66' is used instead of the coating 66 in the FIG. 5 embodiment to admit pump light 64 into the gain medium of core 52 and to reflect the once-amplified input beam 42 back into the waveguide 50 for a second amplification pass through the gain medium of core 52. The curved dichroic mirror 66' is spaced a distance away from the aperture or face 56 and is curved to re-focus the once-amplified beam 42' emerging from face 56 back into the aperture or face 56 with the desired spatial profile, allowing optical devices, such as electro-optic switches (not shown) and saturatable absorbers (not shown) to be inserted.

As is well-known in the art, a laser resonator is quite similar to an optical amplifier, except that reflectors are used at opposite ends of an amplifier gain medium to reflect amplified light many times back and forth through the amplifier gain medium for additional re-amplification. Therefore, a multi-mode, rectangular, self-imaging waveguide can also be used according to this invention to provide power scalable, multi-mode, laser resonators that produce output beams with desired spatial profiles, e.g., with $TEM_{00}$ or Gaussian or super-Gaussian output beam profiles. A super-Gaussian beam is a profile that is raised to a higher power exponent than one; and in the limit of high order, the super Gaussian becomes a square transverse profile.

Figure 7:
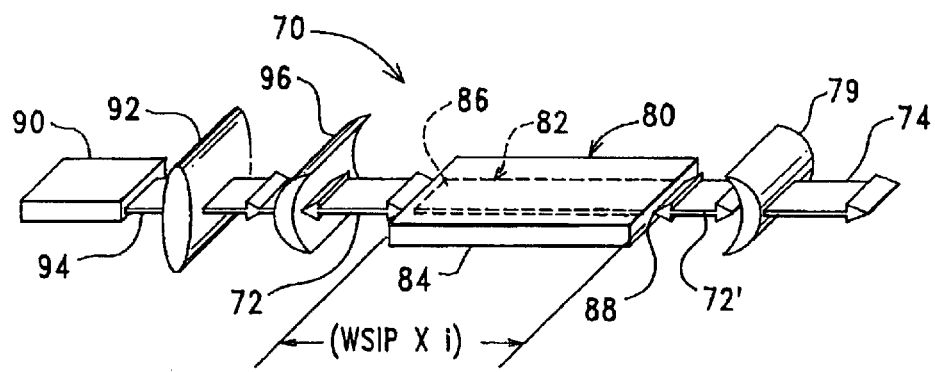
FIG. 7 is a diagrammatic, isometric view of a high-power laser resonator according to this invention.

An example laser resonator 70, which includes a multi-mode, rectangular, self-imaging waveguide 80 amplifier according to this invention is shown in FIG. 7. Essentially, a multi-mode, rectangular, self-imaging waveguide 80 with a core 82 comprising an optical gain medium, such as Nd:YAG or any other suitable gain medium material, is excited or pumped to emit light energy 72, 72' from opposite faces or apertures 86, 88 of the core 82. The gain medium of core 82 can be excited or pumped optically with light energy from a laser diode 90, as shown in FIG. 7, or from any of myriad other know light energy sources, or, if the gain medium is a laser diode compatible material, it can be excited electrically to emit light energy 72, 72'. A laser diode compatible material and structure is one in which electrically pumped gain medium produces optical gain and thereby coherent light as an output. Persons skilled in the art are aware of, and capable of implementing, such excitation or pumping techniques, so it is not necessary to explain them here for an understanding of this invention. In the laser resonator 70 illustrated diagrammatically in FIG. 7, the pump light 94 from laser diode 90 is focused into the aperture or face 86 of the core 82 by a lens system 92, although it could be coupled into the core 82 through any other side surface, as explained above in relation to the optical amplifier illustrated in FIG. 1.

The curved mirror or reflector 96 is dichroic in this arrangement, similar to the reflector 66' in FIG. 6, to transmit pump light 94 of a wavelength produced by the laser diode 90, but to reflect light energy 72 of a wavelength emitted by the core 82 of waveguide 80. Therefore, light energy 72 emitted from the aperture or face 86 of core 82 is reflected by the mirror 96 back into the core 82.

The curved mirror or reflector 70 adjacent the opposite face or aperture 88 is partially reflective of light energy 72' of a wavelength emitted by the gain medium of core 82. For example, but not for limitation, the mirror 79 may be fabricated to reflect about 80–90 percent of the light energy 72' and to transmit about 10–20 percent of such light energy as output beam 74. Thus, 80–90 percent of the light energy 72, 72' emitted by the core 82 will be reflected or resonated back and forth through the gain medium of core 82 many times, and with each such pass through the gain medium of core 82, the light energy 72, 72' is further amplified with energy derived by the pump light 94. Therefore, the light beams 72, 72' become very intense, and, the output beam 74 also becomes very intense. According to this invention, the waveguide 80 is multi-mode, so the core 82 can be very large, which enables it to handle high energy levels and still maintain its optical and structural integrity.

Also, according to this invention, the curved mirrors 96, 79 are shaped and spaced from the respective core apertures or faces 86, 88 in such a manner as to condition and focus the light energy 72, 72' onto the faces 86, 88 with a desired spatial profile, for example, a $TEM_{00}$ or Gaussian profile. Further, according to this invention, the core 82 length extending between opposite faces 56, 58 is a non-zero, positive integer multiple of the waveguide self-imaging period (WSIP), i.e., a length equal to WSIP×i. Therefore, even though the light energy 72,72' reflected back into the waveguide 82 breaks into as many modes of propagation as the dimensions of the rectangular waveguide will allow, thus interferes and changes spatial profile as it is being amplified in the gain medium of the core 22, it always re-images for emission at the apertures or faces 56, 58 with the SMAE desired spatial profile as was shaped for input by the mirrors 96, 79. Therefore, the intense, highly amplified, output laser beam 74 will have spatial as well as temporal coherence with a desired spatial profile, such as the $TEM_{00}$ Gaussian beam described above.

While it is not shown, the dichroic mirror 96 in FIG. 7 could be replaced by a dichroic coating, such as the dichroic coating 66 shown in the amplifier in FIG. 5, on aperture or face 86 or the partially reflective mirror 79 could be replaced by a partially reflective coating (not shown) on the aperture or face 88. However, something on or adjacent at least one of the ends or faces 86, 88 has to focus or otherwise provide the desired beam spatial profile on at least one of the faces or apertures 86, 88. Therefore, at least one of the curved mirrors 96, 79 is needed to provide free-space focusing of a beam 72, 72' on a core face or aperture 86, 88, or some other optic arrangement to provide the desired spatial profile on an aperture or face 86, 88 would have to be provided. For example, one or both of the reflective coatings discussed above could be graded reflectively across its surface to reflect only a Gaussian spatial profile back into the core 82.

Figure 8:
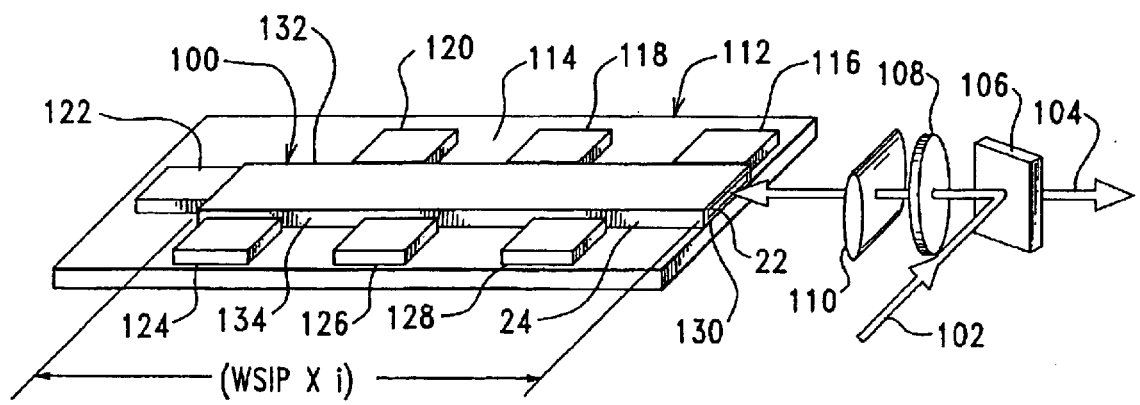
FIG. 8 is a diagrammatic, isometric view of a side-pumped and end-pumped high-power optical amplifier according to this invention mounted on a heat sink.

As illustrated in FIG. 8, a broad heat sink 112 with a flat surface 114 can be used to mount and support an elongated, multi-mode, rectangular waveguide amplifier 100 as well as a number of laser diode pump light sources 116, 118, 120, 122, 124, 126, 128. The top flat surface 114 of the heat sink 112 is coupled by thermal conduction to a flat bottom surface of the rectangular waveguide 100. As mentioned above, quasi-one-dimensional waveguides or other rectangular waveguides with a large aspect ratio of transverse widths or thicknesses, i.e., much wider in the direction of one axis 23 than in the direction of the other axis 21 (see FIG. 2 and related discussion above), result in nearly one-dimensional heat flow from the core 22 through the cladding 24. Therefore, such a broad aspect ratio is particularly beneficial for thermal coupling of a broad, flat side 130 of the waveguide 100 to the heat sink 112 for efficient dissipation of heat from the waveguide 100 to the heat sink 112. Likewise, the flat sides of the laser diode pump sources 116, 118, 120, 122, 124, 126, 128 are conducive to such efficient thermal coupling and heat dissipation to the heat sink 112.

Also, the elongated, narrow sides of the waveguide 100 accommodate optical coupling of wide-beam, stacked laser diode pump sources 116, 118, 120, 122, 124, 126, 128 to the waveguide core 22 without significant light energy losses or need for focusing systems. Basically, the cladding 24 can be a material that is transparent to the pump light, as long as it has a lower index of refraction as required to confine light in the waveguide according to well-known principles. As shown in FIG. 8, laser diodes 116, 118, 120 coupled to one lateral side 132 of waveguide 100 can be offset in relation to the laser diodes 124, 126, 128 coupled to the other side 134 of the waveguide in order to spread the pump light evenly along the whole length of the waveguide 100 for more efficient absorption of the pump light in the core 22. Of course, unstaggered pump diode mounting configurations are also possible to increase the pump light population of the device.

Figure 9:
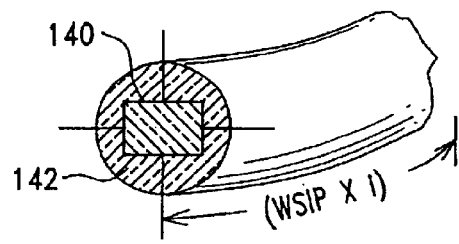
FIG. 9 illustrates a multi-mode, rectangular, waveguide clad in an optical fiber embodiment for use in an optic amplifier, laser resonator, beam transport, or other application of this invention.
Figure 9A:
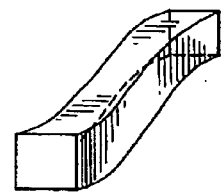
FIGS. 9a and 9b provide two elements of a waveguide in accordance with the present invention.
Figure 9B:
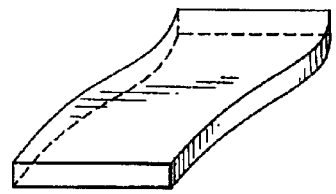

The multi-mode, rectangular waveguide for amplifier or laser applications according to this invention can also have optical fiber cladding 142, as illustrated in FIG. 9, since the cladding 142 does not have to rectangular as long as it surrounds the rectangular core 140 and optically confines the light in the core 140, such as by having a lower index of refraction, as described above. An additional embodiment may provide a multi-mode rectangular waveguide with a high index-of-refraction core and no cladding, as shown in FIGS. 9a and 9b. The opposite aperture or face is not shown, but, again, would be positioned to provide a waveguide length equal to WSIP×i for the reasons described above. Pump light can be injected into the cladding 142 to pump the core 140.

Figure 10:
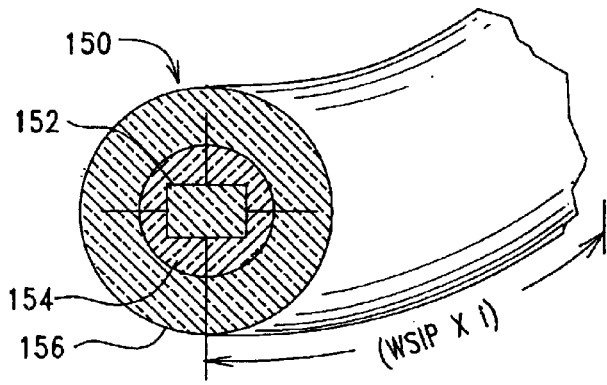
FIG. 10 illustrates a multi-mode, rectangular waveguide that is double-clad in an optical fiber embodiment that is particularly useful for providing pump light energy through the intermediate cladding layer to the multi-mode, rectangular waveguide core in amplifier or laser resonator applications of this invention.

A double-clad fiber optic amplifier or laser structure 150 is shown diagrammatically in FIG. 10, wherein the multi-mode, rectangular waveguide core 152 is surrounded by a first cladding 154 that carries pump light energy to the core 152. The first cladding 154 is surrounded by a second cladding 156 to confine the pump light in the first cladding 154. Therefore, the first cladding has an index of refraction less than the core 152 in order to confine the amplified light in the core 152, and the second cladding 156 has an index of refraction less than the first cladding 154 to confine the pump light in the first cladding 154. This "double-clad" configuration 150 is generally more desirable than the single-clad configuration just described, because contact induced pump light losses can be practically eliminated. The pump light enters the core 152 at virtually all angles, thus providing efficient saturation of the core 152 with pump light energy. Of course, the length of the waveguide 152 between its two faces (not shown) is equal to WSIP×i, as described above.

Figure 11:
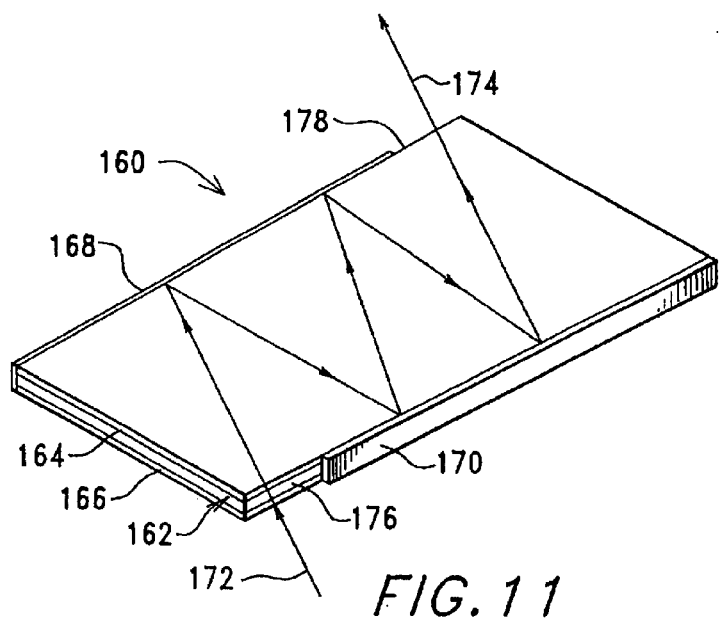
FIG. 11 is an isometric, diagrammatic view of a multi-mode, rectangular waveguide embodiment in which a beam is propagated in a zig-zag path to increase amplification and energy extraction efficiency.

In another multi-mode, rectangular waveguide embodiment 160, illustrated in FIG. 11, which waveguide 160 can be used according to this invention for both optical amplifier and laser resonator applications, the waveguide 160 comprises a core 162 comprising gain medium sandwiched between two cladding layers 164, 166. Two mirrors or reflective coatings 168, 170 cover portions of the lateral edges of the waveguide 160, and the input beam 172 is directed at an angle into the first waveguide aperture or face 176 toward the opposite reflective coating 168. The beam 172 is reflected by coating or mirror 170, which also reflects its back toward mirror 168, etc. Consequently, the beam 172 propagates through the waveguide 160 in a zig-zag path that is much longer than a straight path through the waveguide 160. Eventually, the beam emerges as an output beam 174 from a second aperture or face 178 that is not covered by the reflector 168. The longer path of the beam 172 through the waveguide 160 allows more amplification of the beam 172 and more extraction of energy from whatever pump light or other apparatus or method (not shown in FIG. 11) is used to excite or pump the gain medium of core 172. In this case, the effective waveguide length between the first face 176 and the second face 178 is the length of the zig-zag path of the beam 172 through the waveguide 160, not a straight line length from the first face 176 to the second face 178. Therefore, the zig-zag length would have to be equal to WSIP×i, according to this invention. This zig-zag embodiment is particularly adaptable to a one-dimensional or quasi-one-dimensional multi-mode waveguide configuration, as described above.

An alternate embodiment optical amplifier illustrates use of a multi-mode, waveguide 20 similar to FIG. 1, but with a non-clad core 22, which can also be used with any of the input/output optics and laser resonator equipment and processed described above. For example, a core 22 comprising a gain medium of Nd-doped phosphate glass has an index of refraction that is high enough in relation to air or a gas, such as argon or nitrogen, at atmospheric pressure to provide total confinement of a light beam 12 in the core 22 positioned in such an atmosphere without any other solid or liquid cladding or reflective material on the surfaces of the core 22. Other core materials that are transparent to the light beam 12 and a high enough index of refraction to provide such total confinement in a gas atmosphere could also be used in this manner. FIGS. 9a and 9b depict embodiments of non-clad structure.

As mentioned above, an aspect of the multi-mode, re-imaging, rectangular waveguide principles of this invention can also be extended and applied to passive transport of high power beams while maintaining desired beam quality, temporal and spatial coherence and profile, polarization, phasing, etc., to points of launch or application of such beams to industrial, medical, imaging, ranging, tracking, and the like. This aspect of the invention, therefore, is directed to the guidance and transport of a "beam". "Beam", in accordance with embodiments of the present invention, may be construed to encompass an energy source, comprised of one or a plurality of waves of energy represented by one or a plurality of vector rays, or one or a plurality of beams thereof, as further defined in the present application, and may potentially include streams of particles, such as electrons, and may be provided in the form of an image or images.

A rectangular geometry as provided in self-imaging mode (SIM) waveguide embodiments of the present invention periodically images the input spatial profile of an input beam or image in multi-mode waveguides with an aperture area, and in some embodiments corresponding to a cross-section of the waveguide core, that may be orders-of-magnitude larger than a single-mode aperture area or cross-section of core. Such configuration results in the re-construction of the input spatial profile, generally, or that of the input complex amplitude profile. If the rectangular waveguide core is comprised of a gas, gases, air, or vacuum, then nonlinear distortions of the spatial, spectral, and temporal coherence can be largely avoided, as described below, potentially up to the breakdown limits of the waveguide walls or cladding and potentially assuming linear reflectivity of the waveguide walls. Thus, for corresponding intensity limits, the guided wave, high power, beam transport systems of the present invention can handle optical powers that may be orders-of-magnitude larger than single-mode waveguide systems while still reproducing and delivering the same input beam or image at the output. The increase of power handling capability may correspond to the increase in waveguide aperture area, as more particularly described below.

The multi-mode waveguide propagation in high power beam transport embodiments of the present invention provide periodic imaging of the input beam so that by incorporating a waveguide length determined to be an integral number of imaging periods, an entire beam profile or image can be transported and recovered through a single waveguide core. In accordance with some embodiments, the complex optical transfer function of an injected or otherwise introduced beam or image into a rectangular hollow waveguide at the periodic self-imaging distance (WISP or $D_W$) may be essentially that of the Fourier-plane filter action of a rectangular slit input aperture with no accumulated phase errors except those introduced by diffraction and spatial filtering at the input aperture or wall or end of the waveguide and waveguide core. Thus, for example, a $TEM_{00}$ (Gaussian) beam can be injected into a multi-mode rectangular waveguide of the present invention and recovered at a propagation distance that corresponds to an image plane or self-imaging distance $D_W$.

The rectangular waveguide geometry of the present invention may further preserve polarization with either uniform or non-uniform index profiles in either transverse direction, as further described below.

Figure 13:
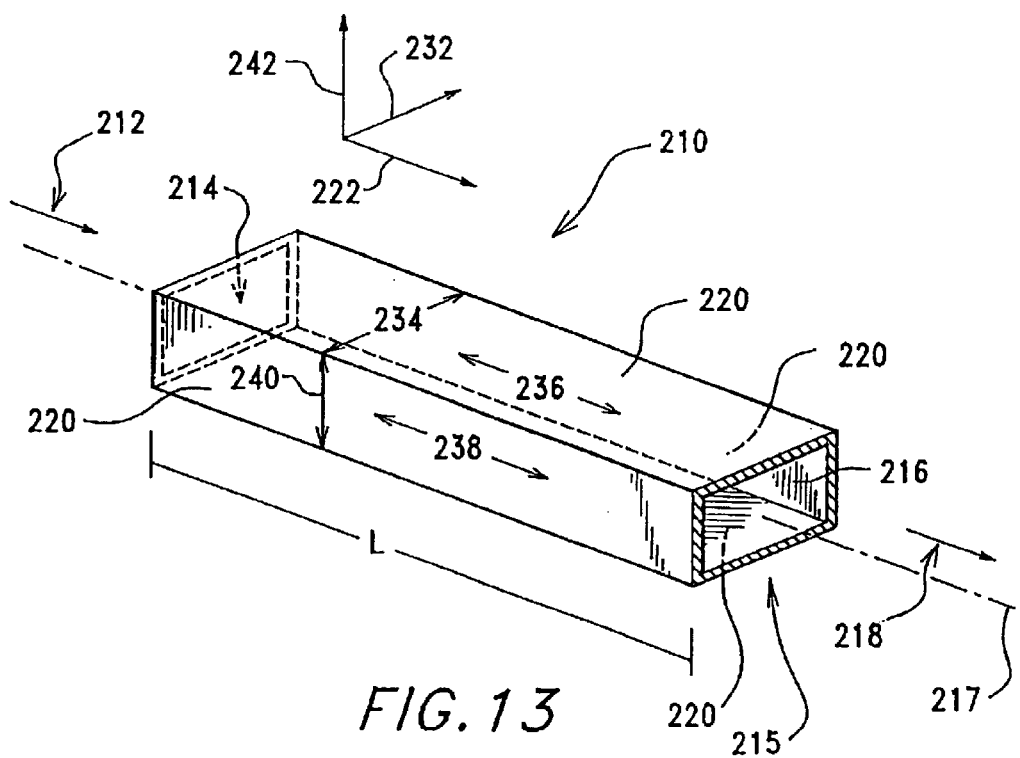
FIG. 13 is a diagrammatic view of one embodiment of a multi-phase, self-imaging rectangular hollow waveguide in accordance with the present invention.

Periodic re-phased self-imaging is accomplished in self-imaging guided wave systems, beam transports, and waveguides, in accordance with an embodiment of the present invention, wherein the waveguide is multi-mode and has a rectangular aperture or cross-section. The preferred waveguide length (L), as exemplarily depicted in FIG. 13, is chosen such that the optical path length is an integral multiple of a determined self-imaging period which results in the output beam profile or the output spatial profile being a re-construction of the profile or image of the input beam.

The high power, beam transport waveguide of the present invention may be fabricated of various materials in accordance with traditional techniques in the art, for example, fabricated as a stiff (for example, crystalline materials) or flexible (such as an optical fiber or hollow rectangular duct) waveguide. Hollow waveguides of the present invention may be further formed, embossed, coated or otherwise fabricated with various coatings, and in some instances fabricated with dielectric coatings, depending on the desired characteristics of the wave guide and the particular application or applications to which the waveguide is to be applied.

Hollow waveguide embodiments may incur slight waveguide bending, twisting, and/or buckling, due in part to their reduced structural robustness, and possibly as a result of waveguide installation, potentially resulting in a small perturbation of the periodic self-imaging properties that may not affect the overall device behavior. However, such waveguide modification may be beneficial and may create desirable waveguide characteristics, as more particularly described below.

Optical amplification in the waveguide core, in active embodiments, may be conducted so as not to significantly alter the waveguide self-imaging properties other than to produce an amplified image of the input beam, wherein each successive image plane at a re-phasing self-imaging period may be an amplified image of the previous image plane. Amplification may occur as determined by the distribution of gain in the core.

One embodiment of the present invention, provided as a rectangular cross-section, SIM waveguide, is shown in FIG. 13. An input beam 212, represented as an arrow, is introduced to an optical aperture, entrance face, or cross-section 214 of the waveguide 210. In some embodiments, one or a plurality of lens may be used to input, inject or otherwise introduce an input beam to the interior region or core 16. One or a plurality of lens may be used to output an output beam from the interior region or core 16. FIG. 7 depicts one embodiment of the invention incorporating a lens for the input or output of a beam into a waveguide. Embodiments may also provide a coupling of a waveguide of the present invention with a waveguide for either the input, injection or otherwise introduction of an input beam or an output of an output beam to or from a waveguide of the present invention. The waveguide used to input a beam or used in the reception of an output beam from a waveguide of the present invention may, but need not necessarily, comprise a waveguide of the present invention. Abutment couplings can also used to couple beams from an optical amplifier or laser resonator of this invention as described above into the multi-mode, rectangular beam transport waveguide 210. The waveguide interior or core may be hollow, as exemplary depicted in FIG. 13; that is, composed, pumped or otherwise comprised of a gas or gases, air, or vacuum, as described below. The core may also be composed of a solid or liquid (not depicted).

Figure 12:
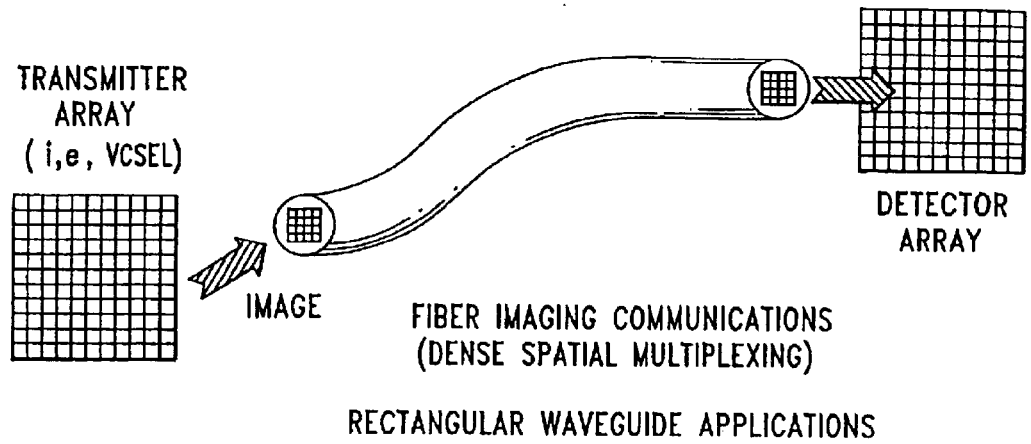
FIG. 12 is a diagrammatic view of a non-clad, multi-mode, rectangular waveguide in an amplifier laser resonator embodiment of this invention.
Figure 15:
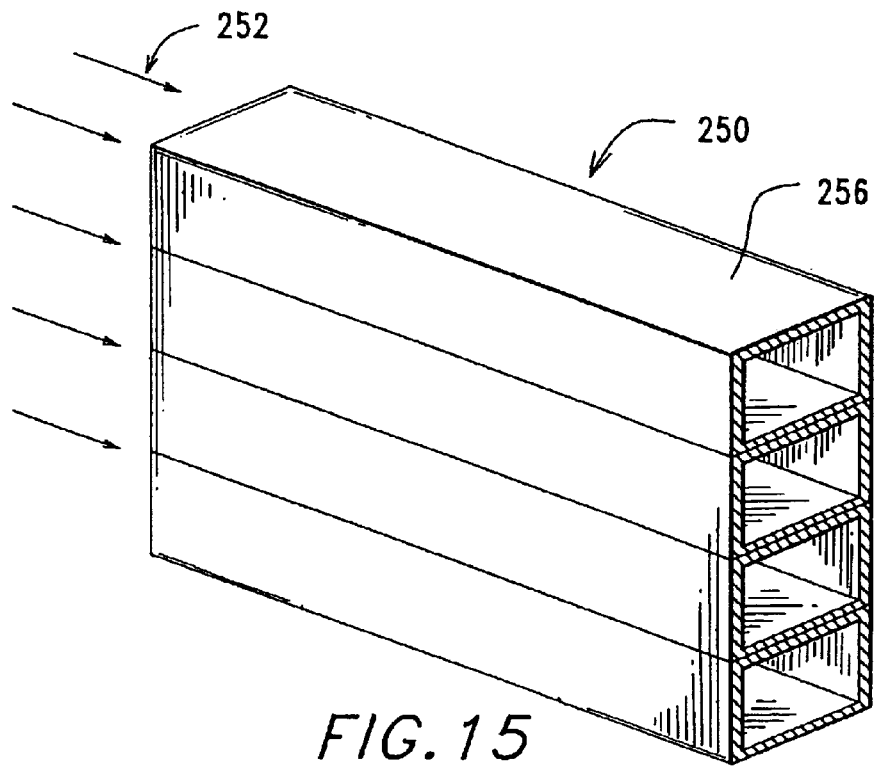
FIG. 15 is a diagrammatic view of one embodiment of a stacked waveguide array in accordance with the present invention.
Figures 17A, 17B, 17C:
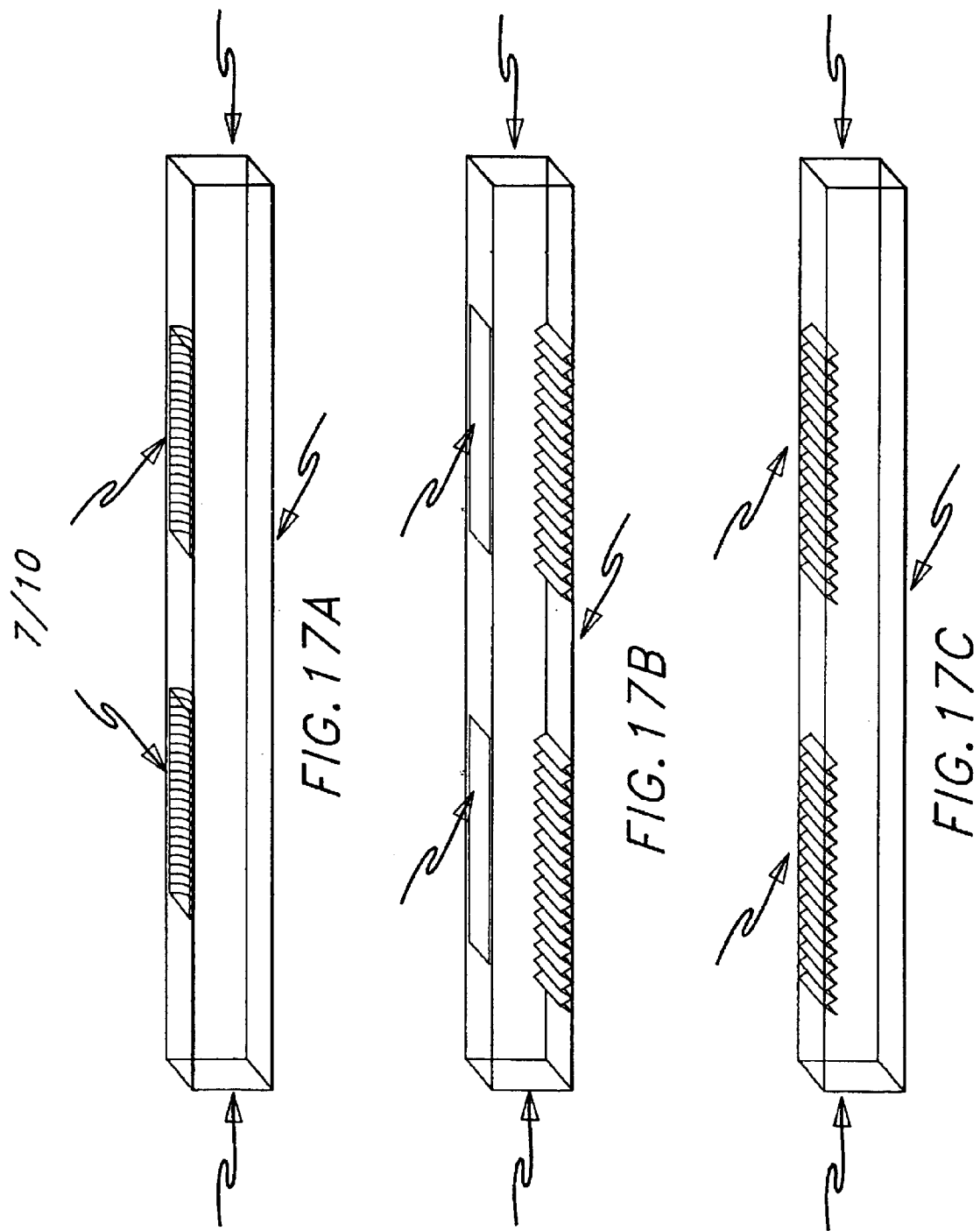
FIGS. 17(a–c) are a perspective views of waveguide embodiments providing three embodiments of wall output couplings providing curvilinear or rectilinear gratings in accordance with the present invention.

FIG. 15 depicts a second embodiment of the present invention, in which a plurality waveguides 250 may be stacked or otherwise configured in accordance with other features disclosed herein. Input beams 252, represented as arrows, may be introduced to an optical aperture, entrance face, or cross-section of each waveguide 256 for multiple beam applications in accordance with the present invention. In some embodiments, relative phase shifts between waveguides may be deterministically controlled, for example, by phase shift elements, in order to produce a desired wavefront, either for hollow or dielectric core waveguides. FIG. 12 further provides an embodiment of such stacked or configured waveguides, wherein a beam or image (depicted), for a plurality of beams or images, may be transmitted or input from one or a plurality of sources, for example a transmitter array or VCSEL, into a stacked waveguide, more particularly provided herein in FIG. 12 as a 2-dimensional waveguide array, potentially comprising a plurality of discrete waveguide portions forming the 2-dimensional array. A simple waveguide may also provide beam or image transport, and may further provide transport, and may further provide transport of a VCSEL array.

The multi-mode waveguide self-images the beam 212 at the determined self-imaging period in the manner previously described. The wave guide length is chosen such that the optical path length is an integral number of the wavelength self-imaging period (WISP). The output beam 218 is a reconstructed or otherwise re-phased beam or image of the input beam and having the same beam profile. For example, the beam 212 is coupled, injected, or otherwise introduced into the waveguide through the entrance face or cross-section 214, which may serve as an aperture. The beam travels along a central propagation axis, and exits the waveguide at an exit face or cross-section 215. The length (L) of the waveguide may be chosen such that the optical path length is an integral number of the WISP as described above. If the beam travels at a non-zero angle relative to a central axis of the waveguide, the optical path or effective waveguide length will differ from the length (L), as explained above in relation to FIG. 11.

Furthermore, the interior region or core 216, provided as a hollow core that may be formed, embossed, coated or otherwise fabricated with various coatings, including dielectric coatings, as previously described, may be surrounded by walls or cladding 220. The cladding, in some embodiments, surrounds the core so as to permit optical confinement. Optical confinement, however, may be provided by other techniques such as internal reflection from lower index-of-refraction layers or cladding layers, or of the surrounding atmosphere, if the core index of refraction is high enough, such as phosphate glass, as described above. Walls or cladding 220 may take on a shape distinct from the cross-sectional shape or aperture of the waveguide, for example, as shown in FIG. 9 above. Additional regions exterior to the cladding may be provided in some embodiments to increase structural robustness.

Cladding 220 may form a reflective region, and some embodiments may provide cladding composed of a medium of a lower index of refraction as compared to core 216, to provide for total-internal-reflection, a medium of intrinsic reflectivity at the propagation wavelength of a beam, such as metal, or one or more dielectric coatings that reflect the beam of a particular wavelength, among others. However, hollow, passive systems may, in some embodiments, avoid dielectric coatings such that grounding or other effects and resulting damage to the waveguide can be avoided.

Figure 13A:
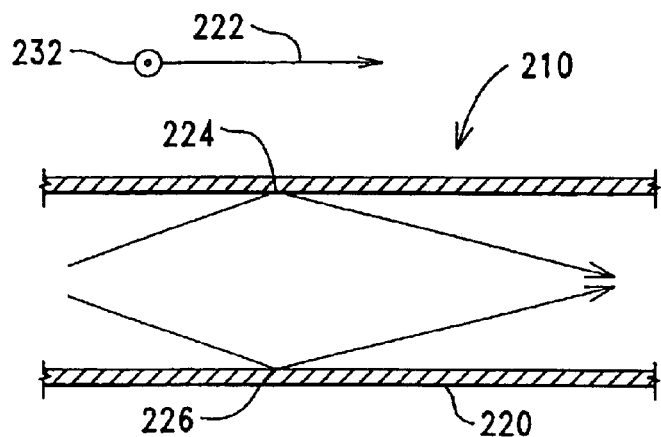
FIG. 13(a) is a cross-sectional view depicting wave propagation through a waveguide in accordance with the present invention.
Figure 14:
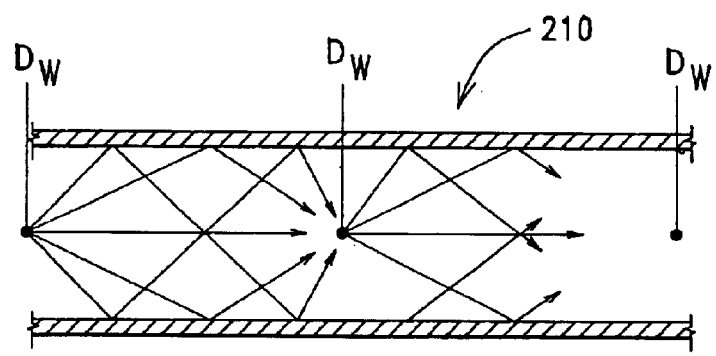
FIG. 14 is a cross-sectional view depicting multi-phase, self imaging formation in a waveguide in accordance with the present invention.

Reflections along an axis 222 of transverse waveguide dimension 234 (depicted relative to the top portion of waveguide 210) may occur at opposing core/cladding interfaces 224, 226 as shown in cross-section in FIG. 13(a). Reflections along the transverse waveguide dimension 240 may also occur at opposing core/cladding interfaces (not depicted). The WSIP from one pair of opposing core/cladding interfaces, such as interfaces 224, 226, will be different from a second pair of opposing core/cladding interfaces, for example, interfaces relative to transverse dimension 240, if a particular waveguide beam transport embodiment is not square. The present invention, therefore, may provide a high power beam transport waveguide fabricated or otherwise dimensioned such that it is multi-mode in at least one transverse direction. Embodiments of the present invention may provide beam transport waveguides of varying dimensions.

Furthermore, embodiments of the present invention may be provided as a virtual one-dimensional guided wave system, beam transport, or waveguide, such techniques having a large dimensional aspect ratio for transverse dimensions. Embodiments of rectangular shape, for example, may have a width along an axis, for example a width along axis 242, i.e. a width along transverse dimension 240, that is significantly smaller than, or negligible as compared to, the width along a second axis, for example a width along axis 232, i.e. a width along transverse dimension 234. A corresponding guided wave system, beam transport, or waveguide would be consider virtually one dimensional if the beam divergence, based at least in part upon the system configuration, along axis 232 propagating along axis 222, is small compared to the waveguide width of transverse dimension 234, and if the beam divergence along axis 242 propagating along axis 222, is large compared to the waveguide width of transverse dimension 240, such that a beam will reflect from interfaces 224 and 226, effectively creating self-imaging from only one pair of interfaces, and minimizing self-imaging from other interface reflections. Waveguide configurations providing a square cross-section or aperture will have an equal self-imaging period or WISP and may be considered two-dimensional in such regard.

Figure 18:
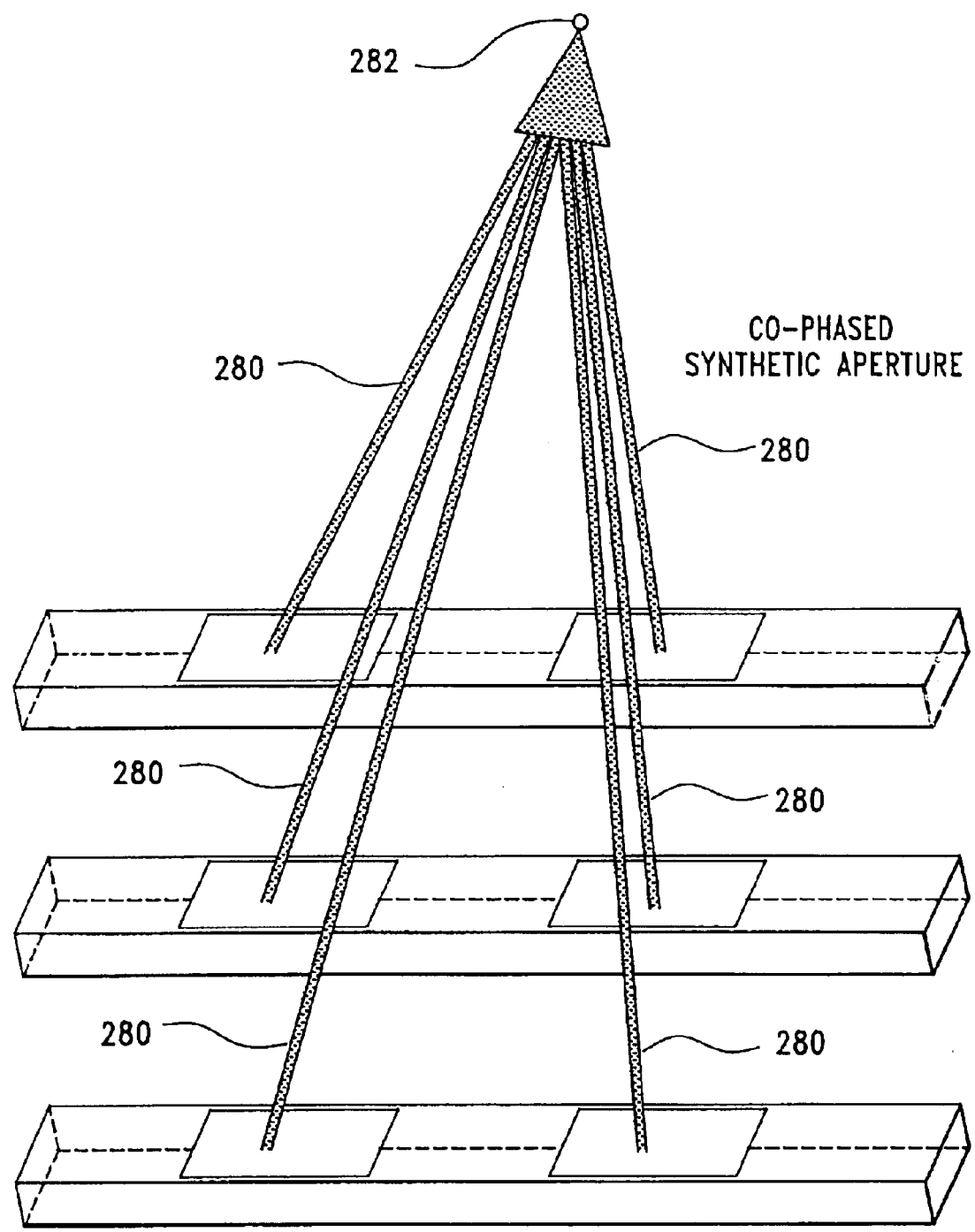
FIG. 18 is a perspective view of multiple waveguides providing multiple features of the present invention.

Furthermore, the present invention may provide one or a plurality of intermediate exit surfaces, faces or apertures, as generally depicted in FIGS. 16(a–c), 17(a–c), and FIG. 18. Each exit surface, face or aperture may be a sidewall launch 250 for intermediate beam transport from the waveguide 252. Additionally, each intermediate surface, face or aperture may serve in combination or singly, with respect to launch aspects, as a sidewall recovery, providing an entrance surface, face or aperture to transport or otherwise transmit beams or other energy into the waveguide. Embodiments of sidewall launches consistent with the present invention include grating technology, and in some embodiments diffraction grating, prism apertures, and in some embodiments prism evanescent wave coupling, liquid-crystal apertures, microelectro-mechanical apertures, aperture-window technology, generally, and arrays thereof, among other aperture technology. Sidewall launches may be particularly applicable to systems providing one or more potentially desirable features such as synthetic aperture, distributed aperture, beam forming, beam steering, and power sampling, among other features. Sidewall launches may be provided as coherent or incoherent sources, coherent sources particularly beneficial in imaging applications, for example, and incoherent sources particularly beneficial in laser medium pumping and radiometric applications.

It may be desirable in sidewall launch and recovery applications to keep coupling of exiting and entering beams to the waveguide at a minimum, preferably in some embodiments such that significant amounts of power from propagating energy within the waveguide is not extracted in less than a self-imaging period or distance. Asymmetric coupling of a guided beam can result in undesirable perturbations of the SIM waveguide and thereby perturb the outcoupled beam. Sidewall configuration for launch and recovery applications, therefore, may in preferred embodiments configure each sidewall launch or recovery with corresponding self-imaging periods $D_W$ relevant to the waveguide and the guided energy. However, embodiments providing sidewall configurations not corresponding to self-imaging periods and distances are also considered part of the present invention.

Figure 19:
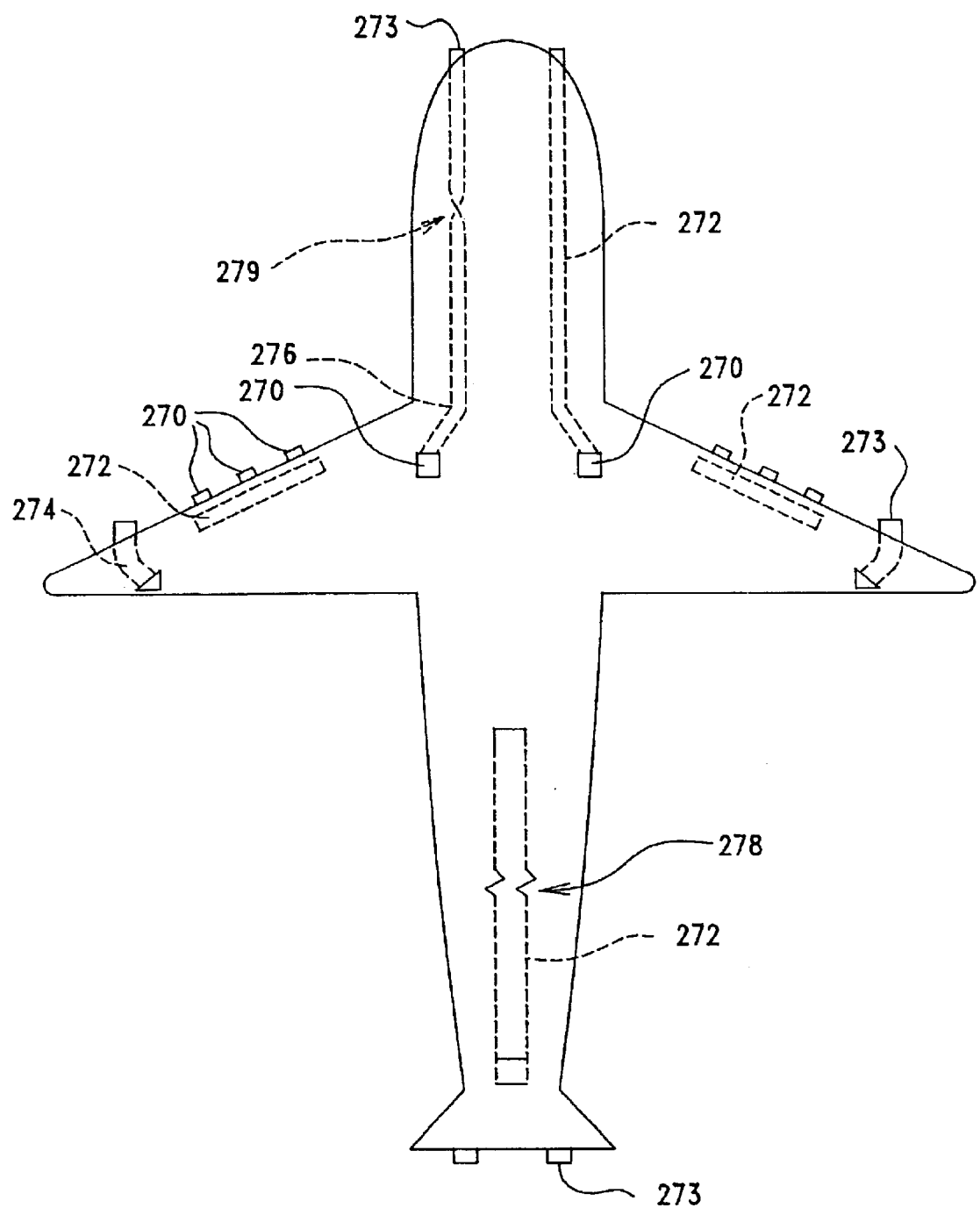
FIG. 19 is a outlined view of an aircraft providing potential configuration for some embodiments of the present invention for particular applications.

Specific fields may especially benefit from sidewall launch technology, particularly aeronautical and space applications, directed energy systems, object imaging systems, object positioning and tracking systems, and detection systems, among others. As but one example, and as depicted in FIG. 19, sidewall launches and recoveries 270, and sidewall launches and recoveries 273, generally, may be provided associated with corresponding waveguides 272, on aircraft for uses such as radar and ladar tracking systems, among other imaging, object positioning and tracking, and detection systems and directed energy systems, such as laser weapons systems, and even collimated optic systems.

Embodiments of the present invention may further provide the feature of synthetic apertures and techniques thereof. Accordingly, multiple exit surfaces, faces, or apertures, as depicted for one embodiment in FIG. 18, may be provided, potentially as part of one or a plurality of arrays and potentially in conjunction with one or a plurality of waveguides. Synthetic aperture techniques may be particularly useful in providing, for example, synthesized values from launch and recovery systems, potentially providing high resolution results, particularly in moving systems such as may be applied in aeronautic and space applications, among others. Furthermore, and as generally depicted in FIG. 6, each exit surface, face or apertures, launch or recovery, waveguide end or intermediate element, may provide vector direction, or beam steering, of a launched or otherwise directed beam. In the embodiment of FIG. 18, beams 280 are formed from individual exit surfaces, faces, apertures, or launches and may be steered, outcoupled, or otherwise directed in a particular direction. Such beam forming and steering may be provided by diffractive or refractive techniques, such as refractive indexing, and with other such technology, such as grating, prism apertures, and in some embodiments prism evanescent wave coupling, liquid-crystal apertures, microelectro-mechanical apertures, aperture-window technology, generally, and arrays thereof, among other aperture technology. One embodiment may provide differential refraction periods for one or a plurality of exit surfaces, faces or apertures, such that multiple beam forming and steering from one exit surface, face, aperture or launch may occur either singly or in combination. Additionally, such beam forming may be applicable to systems wherein the diversion of power from the waveguide is desirable, as in power monitoring of the waveguide and in power splitting techniques, generally.

Figure 20A:
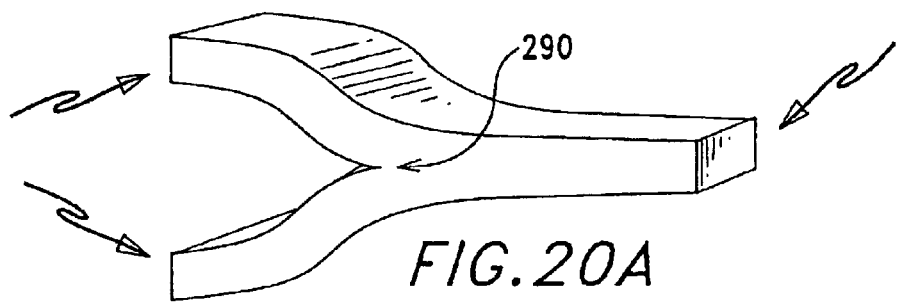
FIGS. 20(a, b) are views of embodiments of the present invention describing, at least beam combining and beam splitting, in accordance with the present invention.
FIG. 20(c) is a cross-sectional view of one embodiment depicting output coupling between waveguides.
Figure 20B:
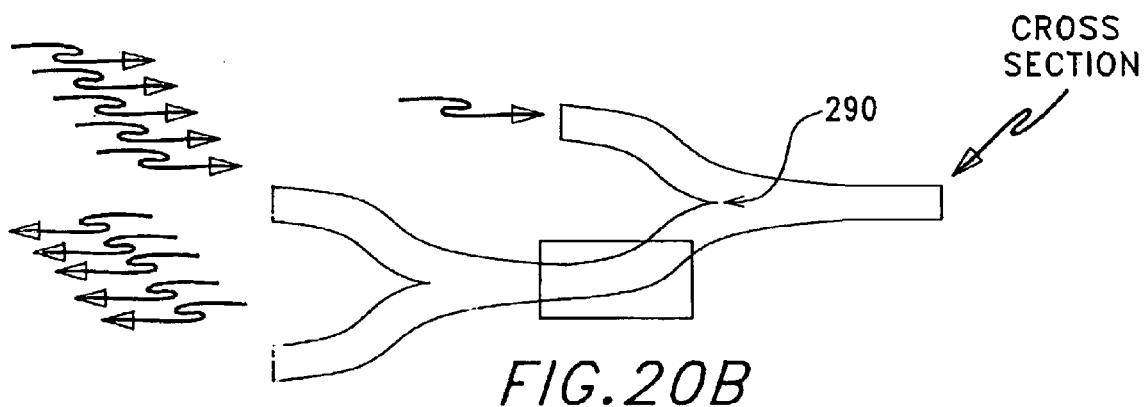
Figure 20C:
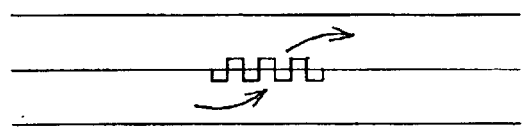

Embodiments may further comprise the feature of beam combining or power combining. One embodiment of such features is depicted in FIGS. 20(a) and (20(b), wherein multiple branches of waveguides may be coupled such that energy propagating from each are combined into a subsequent guide. Each branch of the multiple waveguides are joined at adiabatic taper sections 290. Coupling between waveguides may also be provided through gratings or other types of diffractive or refractive output coupling, and one embodiment is shown in FIG. 20(c) as a modulated grating output coupling.

Figure 21:
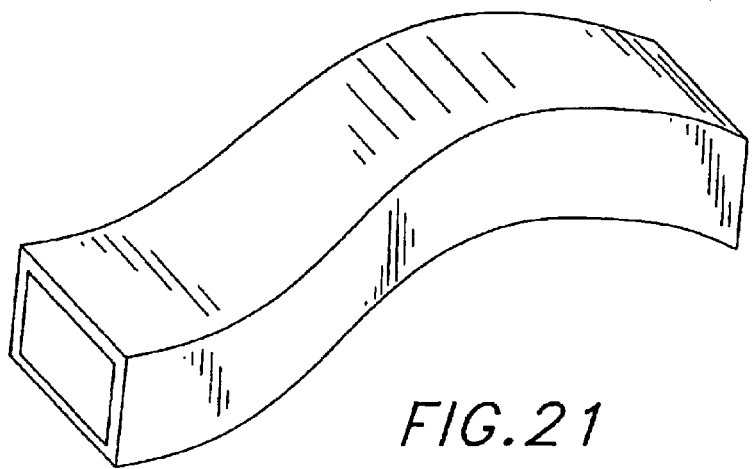
FIG. 21 is a perspective view of one embodiment depicting a flexible waveguide in accordance with the present invention.

As previously mentioned, beam characteristics may be modified based upon bend, buckle, or twist configurations of the waveguide. Some applications may require modification of the waveguide to "fit" or otherwise conform to its environment. One example is depicted in the embodiment of FIG. 19, wherein bends 276, buckles 278, and twists 280 may be provided to conform the waveguides to particular structure of an aircraft and components thereof, such as weapons systems. Furthermore, such bending, buckling and twisting can preferably modify the propagating beam and characteristics thereof, such as spatial coherence. For example, a twist 280 of the waveguide may optically result in beam formation 280 potentially that of incorporating a negative lens, while a bend 276 in the waveguide may optically result in beam formation potentially that of incorporating a positive lens. FIG. 21 represents one embodiment of waveguide deformation in accordance with the invention.

The following table illustrates the various combinations of structures, features and attributes of waveguides (WG) that can be used in various embodiments of this invention:

| Invention aspect | Claim Options | Specific examples |
|---|---|---|
| WG Aperture Geometry | Rectangular | Quasi-One-dimensional Square |
| WG Core Medium | Gas | $CO_2$ |
| | Liquid* | Laser dye in solution |
| | Doped and Undoped Dielectric Solids, semiconductors | Crystalline Poly-crystalline Amorphous (Glass) |
| WG Cladding Medium | Metal (conductor) | Solid metal Metal coated |
| | Dielectric with index of refraction lower than core | Liquid crystal grating arrays, homogeneous index slabs, gradient index slabs, photorefractive materials, doped gain media, nonlinear optical materials |
| | Dielectric coatings | Fluoride and oxide single/multilayer dielectric coatings with tunable phase shifts |
| WG Structure | Stiff | Wafer |
| | Flexible | Optical Fiber |
| WG Length | Optical path length is an integer multiple of the imaging period or fractional re-phasing distances for beam splitting | |
| Active Operation (passive options plus beam modification) | Optical amplifier Electro-optical modulator, degenerate and non-degenerate wave-mixing for phase or amplitude modulation, beam combination and energy transfer | (see options below) Phase modulator Polarization modulator Communications encoding for wavelength division multiplexing, PSK, ASK, QSK, etc. formats |

*Not a common configuration

-continued

| Optical Amplifier | General Example | Specific Example |
|---|---|---|
| Core Host Medium (any laser gain medium) | Glass | Phosphate Silicate |
| | Crystalline, quantum wells | Garnet (YAG, ...) Fluoride (YLF, ...) Sapphire Elemental semiconductors and compound stoichiometric and non-stoichiometric semiconductors, quantum wells, quantum cascades, and all forms of hetero-junctions |
| | Gas | $CO_2$ |
| Solid Core Active Ion (any laser active ion) | Rare Earth | Nd Er Yb |
| | Transition Metal | Cr Ti |
| Pumping Scheme (any laser pump scheme) | Optical | Flashlamp Laser Laser diode array Solar illumination |
| | Electrical | Semiconductor diode WG amplifier/laser |
| Optical/Electrical Pumping Geometry | Longitudinal | Preferable for any WG aperture geometry |
| | Transverse | Preferable for one-dimensional WG along wide transverse axis Face pumping may be useful for semiconductor lasers and control beams for dynamic wave mixing and gratings. |
| Application specific | Component of laser | WG comprises entire laser WG amplifier is component of laser system |
| | Image Amplifier | Endoscope, ladar preamplifier |

Since these and numerous other modifications and combinations of the above-described method and embodiments will readily occur to those skilled in the art, it is not desired to limit the invention to the exact construction and process shown and described above. For example, Accordingly, resort may be made to all suitable modifications and equivalents that fall within the scope of the invention as defined by the claims which follow. The words "comprise," "comprises," "comprising," "include," "including," and "includes" when used in this specification and in the following claims are intended to specify the presence of stated features or steps, but they do not preclude the presence or addition of one or more other features, steps, or groups thereof. The term "high power" is used in this application to refer to guided wave and beam transport techniques involving high levels of average or peak power, or both. As but one example of high power techniques disclosed herein, the present invention contemplates potential average power values of about 10–20 kilowatts, for example in medical applications, and even about 100 kilowatts in average power for stacked waveguide applications. High power, weapons-class techniques incorporating the present invention may eve have average power values in operation of about 1–3 Megawatts. As but one example of peak power capability, a high power, weapons-class application of the present invention may provide about 20 megawatts of peak power or greater.

What is claimed is:

1. An amplifier for a laser beam that has a wavelength ($\lambda$), comprising:

a multi-mode, self-imaging waveguide having a core comprising a gain or mixing medium with an index of refraction (n) and a core length extending between a core entrance face and a core exit face, said core also having a rectangular cross-section that provides a waveguide width (a), which is large enough to support and propagate multiple modes of the laser beam and a waveguide self-imaging period (WSIP) defined as a distance in the multi-mode waveguide in which a profile or image of the laser beam is periodically re-imaged, wherein $WSIP=4na^2/\lambda$ in general for the laser beam propagating through the core and $WSIP=na^2/\lambda$ when the laser beam is perfectly symmetric with respect to the center of the waveguide, and wherein said core is such that the laser beam propagating through the core from the core entrance fact to the core exit face has an optical path length with a numerical aperture and an exit face that is a non-zero integer multiple of the waveguide self-imaging period (WISP);

a beam input coupling system capable of providing the profile or image of the laser beam with a $TEM_{00}$ wavefront at the core entrance face within the numerical aperture of the core entrance face to propagate the laser beam into and through the waveguide to the exit face; and a pump light source coupled into the waveguide core medium to propagate pump light energy into the core medium to be extracted by the laser beam.

2. The amplifier of claim 1, including a reflector capable of reflecting the laser beam positioned to reflect the laser beam back through the waveguide core.

3. The amplifier of claim 2, wherein the reflector is positioned at the exit face.

4. The amplifier of claim 2, wherein the reflector is positioned outside the waveguide at a distance from the exit face.

5. The amplifier of claim 4, wherein the reflector is shaped to re-focus the reflected laser beam onto the exit face for propagation back through the waveguide core.

6. The amplifier of claim 4, including an optical imaging system between the exit face and the reflector that is capable of re-imaging the reflected laser beam on the exit face for propagation back through the waveguide core.

7. The amplifier of claim 2, including an extraction optical coupling system capable of coupling the reflected laser beam out of the entrance face of the waveguide and separating the reflected laser beam from the pre-amplified laser beam.

8. The amplifier of claim 7, wherein the extraction optical coupling system includes a polarizing beam splitter positioned in the pre-amplified beam and a ¼-$\lambda$ birefringent retarder positioned between the polarizing beam splitter and the entrance face of the waveguide core.

9. The amplifier of claim 2, wherein the pump light source is coupled into the waveguide core medium through the exit face.

10. The amplifier of claim 9, wherein the reflector is transparent to the pump light.

11. The amplifier of claim 1, wherein the pump light source is coupled into the waveguide core medium through a lateral side of the waveguide core medium.

12. The amplifier of claim 11, wherein the pump light source is a laser diode.

13. The amplifier of claim 12, wherein the pump light source produces pump light with a wavelength that is smaller than the wavelength $\lambda$ of the laser beam.

14. The amplifier of claim 11, including multiple pump light sources coupled into lateral sides of the waveguide core medium.

15. The amplifier of claim 1, wherein the gain medium is a semiconductor material.

16. The amplifier of claim 1, wherein the gain medium comprises a doped YAG.

17. The amplifier of claim 16, wherein the gain medium comprises Yb:YAG.

18. The amplifier of claim 16, wherein the semiconductor medium comprises Nd:YAG.

19. The amplifier of claim 1, wherein the gain medium comprises Nd dopant.

20. The amplifier of claim 1, wherein the gain medium comprises a liquid.

21. The amplifier of claim 20, wherein the gain medium comprises $CS_2$.

22. The amplifier of claim 1, wherein the core is rectangular and is clad with a cladding material that has a lower index of refraction than the core.

23. The amplifier of claim 1, wherein the core is rectangular, and has an index of refraction that is sufficiently greater than a surrounding atmosphere to confine the light beam in the core.

24. The amplifier of claim 23, wherein the core comprises Nd-doped, phosphate glass.

25. The amplifier of claim 22, including a heat sink positioned adjacent and in contact with the cladding material.

26. The amplifier of claim 22, wherein the cladding material has at least one flat side and the heat sink is positioned in contact with the flat side.

27. A laser resonator for producing a laser beam, comprising:
a multi-mode, self-imaging waveguide positioned in an optical resonator cavity and having a core medium, which, when excited, emits light with a wavelength ($\lambda$), said core medium having a core length extending between a first core face and a second core face and also having an index of refraction (n) and a rectangular cross-section that provides a waveguide width (a), which is large enough to support and propagate multiple modes of a laser beam and a waveguide self-imaging period (WSIP) defined as a distance in the multi-mode waveguide in which a laser beam profile or image is periodically re-imaged, wherein WSIP=$4na^2/\lambda$ in general for the laser beam propagating through the core and WSIP=$na^2/\lambda$ when the laser beam is perfectly symmetric with respect to the center of the waveguide, and wherein said core length is such that the laser beam propagating through the core from the first face to the second face has an optical path length that is a non-zero integer multiple of the waveguide self-imaging period (WSIP), and wherein said optical resonator cavity includes a reflective surface in a configuration that reflects laser light that emanates from the core back into the core with a spatial mode profile that is substantially $TEM_{00}$.

28. The laser resonator of claim 27, including a pump light source coupled optically to the waveguide core medium to propagate pump light energy into the core medium at a wavelength that optically excites the core medium to emit the $\lambda$ wavelength light.

29. The laser resonator of claim 27, wherein the core medium is a photovoltaic semiconductor material and the laser resonator includes electrical contacts positioned adjacent the core medium in a manner that facilitates application of an electric current to excite the semiconductor material to produce the laser light.

30. The laser resonator of claim 27, wherein either the first core face or the second core face includes a rectangular aperture for the laser light to exit and enter the core medium, and wherein the optical resonator cavity includes the reflective surface positioned a distance apart from the core medium and in alignment with the rectangular aperture reflect laser light that emanates from the core medium back into the rectangular aperture with the substantially $TEM_{00}$ spatial mode profile at the rectangular aperture.

31. The laser resonator of claim 27, wherein the reflective surface is curved to focus the reflected laser light on the rectangular aperture with the substantially $TEM_{00}$ spatial mode profile.

32. The laser resonator of claim 30, including a pinhole aperture positioned between the reflective surface and the rectangular aperture so that laser light reflected by the reflective surface has to pass through the pinhole aperture to create the substantially $TEM_{00}$ spatial mode profile in the reflected laser light.

33. The laser resonator of claim 32, including a lens system positioned between the pinhole aperture and the rectangular aperture and configured to focus the substantially $TEM_{00}$ spatial mode profile from the pinhole aperture onto the rectangular aperture.

34. The laser resonator of claim 30, wherein the reflective surface is fully reflective.

35. The laser resonator of claim 30, wherein the reflective surface is partially reflective.

36. The laser resonator of claim 30, wherein the reflective surface is a first reflective surface and the optical resonator cavity includes a second reflective surface with the core medium positioned between the first reflective surface and the second reflective surface.

37. The laser resonator of claim 36, wherein the second reflective surface is fully reflective.

38. The laser resonator of claim 36, wherein the second reflective surface is partially reflective.

39. The laser resonator of claim 36, wherein the second reflective surface is positioned at either the first core face or the second core face.

40. The laser resonator of claim 27, wherein the self-imaging waveguide is rectangular in cross-section.

41. The laser resonator of claim 40, wherein the rectangular waveguide comprises:
a rectangular core medium with flat external surfaces;
cladding on the external surfaces, said cladding also having at least one flat external surface; and
a heat sink positioned in contact with the flat external surface of the cladding.

42. The laser resonator of claim 27, including cladding material with an index of refraction less than the core medium surrounding the core.

43. The laser resonator of claim 42, wherein said cladding material is a first cladding material, and wherein the laser resonator includes:
a second cladding material surrounding the first cladding material and having an index of refraction that is less than the first cladding material; and
a pump light source coupled optically to the first cladding material.

* * * * *